US012720684B2

(12) United States Patent
Kang et al.

(10) Patent No.: US 12,720,684 B2
(45) Date of Patent: Aug. 25, 2026

(54) ELECTRONIC APPARATUS INCLUDING FLEXIBLE PRINTED CIRCUIT BOARD

(71) Applicant: SAMSUNG ELECTRONICS CO., LTD., Suwon-si (KR)

(72) Inventors: Hyunggwang Kang, Suwon-si (KR); Myunghoon Kwak, Suwon-si (KR); Yangwook Kim, Suwon-si (KR); Junhyuk Kim, Suwon-si (KR); Wonho Lee, Suwon-si (KR); Hoyoung Jeong, Suwon-si (KR); Junyoung Choi, Suwon-si (KR); Soyoung Lee, Suwon-si (KR); Jookwan Lee, Suwon-si (KR); Junghyeob Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 240 days.

(21) Appl. No.: 18/746,667

(22) Filed: Jun. 18, 2024

(65) Prior Publication Data

US 2024/0341038 A1 Oct. 10, 2024

Related U.S. Application Data

(63) Continuation of application No. PCT/KR2022/016774, filed on Oct. 30, 2022.

(30) Foreign Application Priority Data

Dec. 21, 2021 (KR) ........................ 10-2021-0184189
Dec. 30, 2021 (KR) ........................ 10-2021-0193119

(51) Int. Cl.
*H05K 1/18* (2026.01)
*H05K 1/11* (2006.01)
*H05K 1/189* (2026.01)

(52) U.S. Cl.
CPC ............. *H05K 1/189* (2013.01); *H05K 1/118* (2013.01); *H05K 2201/10128* (2013.01)

(58) Field of Classification Search
CPC .................. H05K 1/189; H05K 1/118; H05K 2201/10128

(Continued)

(56) References Cited

U.S. PATENT DOCUMENTS

2012/0120619 A1 5/2012 Kodera
2017/0290184 A1* 10/2017 Kim .................... H04M 1/0277
2018/0076412 A1* 3/2018 Kim ...................... G06F 1/1637

FOREIGN PATENT DOCUMENTS

JP 2004-207446 A 7/2004
JP 2008-182522 A 8/2008

(Continued)

OTHER PUBLICATIONS

International Search Report (PCT/ISA/210) issued on Feb. 13, 2023 by the International Searching Authority in International Application No. PCT/KR2022/016774.

(Continued)

*Primary Examiner* — Binh B Tran
(74) *Attorney, Agent, or Firm* — Sughrue Mion, PLLC

(57) ABSTRACT

An electronic device includes: a first housing; a second housing connected to the first housing and being partially moveable in a moving direction; a display supported by the first housing and the second housing and configured to change between a first state and a second state; and a flexible printed circuit board having a length in the moving direction which changes based one the movement of the first housing and the second housing, the flexible printed circuit board includes: a first wire including a first signal circuit formed along a first length direction; a second wire including a second signal circuit formed along a second length direction;

(Continued)

a bonding sheet configured to bond the first wire and the second wire along a bonding area; and one or more signal vias penetrating the first wire and the second wire and electrically connecting the first signal circuit to the second signal circuit.

20 Claims, 21 Drawing Sheets

(58) Field of Classification Search
USPC .......................................................... 361/749
See application file for complete search history.

(56) References Cited

FOREIGN PATENT DOCUMENTS

| | | | |
|---|---|---|---|
| KR | 10-2012-0010524 | A | 2/2012 |
| KR | 10-1159101 | B1 | 6/2012 |
| KR | 10-2017-0069042 | A | 6/2017 |
| KR | 10-2018-0017507 | A | 2/2018 |
| KR | 10-2020-0101201 | A | 8/2020 |
| KR | 10-2021-0022452 | A | 3/2021 |
| KR | 10-2021-0153523 | A | 12/2021 |

OTHER PUBLICATIONS

Written Opinion (PCT/ISA/237) issued on Feb. 13, 2023 by the International Searching Authority in International Application No. PCT/KR2022/016774.

* cited by examiner

ELECTRONIC APPARATUS INCLUDING FLEXIBLE PRINTED CIRCUIT BOARD

CROSS-REFERENCE TO RELATED APPLICATIONS

This application is a continuation of International Application No. PCT/KR2022/016774, filed on Oct. 30, 2022, which is based on and claims priority to Korean Patent Application No. 10-2021-0184189, filed on Dec. 21, 2021 in the Korean Intellectual Property Office and Korean Patent Application No. 10-2021-0193119, filed on Dec. 30, 2021 in the Korean Intellectual Property Office, the disclosures of which are incorporated by reference herein in their entireties.

BACKGROUND ART

1. Field

The disclosure relates to an electronic apparatus including a flexible printed circuit board.

2. Description of the Related Art

Recently, electronic devices, such as portable terminals, have been developed to improve their convenience of use through miniaturization while having various functions to satisfy consumers' purchasing desires. Various components and boards for performing functions are mounted inside an electronic device, and these components may be connected through a flexible printed circuit board (FPCB).

Electronic devices with a varying display area that is exposed to the outside depending on a use state have been developed. For example, a slidable electronic device may adjust a display area exposed to the outside by changing the shape to be expanded or reduced according to a relative movement of a housing. For such a shape-changing electronic device, since a relative position of a plurality of components placed inside changes depending on the movement of a housing, a flexible printed circuit board (FPCB) of which the shape is changeable may be used to electrically connect the components of which the relative position changes. Since the repeated shape changes of an FPCB may cause stress concentration in, for example, a folding portion, a life service of the FPCB may be increased by relieving local stress on the FPCB.

SUMMARY

Provided is an electronic device including an FPCB and stress concentration in the FPCB according to the operations of the electronic device may be alleviated by applying a segmental structure to the FPCB.

Provided is an electronic device including an FPCB where an arrangement space inside the electronic device may be optimized by decreasing an angular change according to a shape change of the FPCB.

According to an aspect of the disclosure, an electronic device includes: a first housing; a second housing connected to the first housing, the second housing being partially moveable in a moving direction; a display supported by the first housing and the second housing and configured to change between a first state and a second state, an area of the display being visually exposed to an outside according to a relative movement of the first housing and the second housing, the first state being a state in which the area of the display is visually exposed at a minimum, the second state being a state in which the area of the display is visually exposed at a maximum; and a flexible printed circuit board having a length in the moving direction which changes based one the movement of the first housing and the second housing, wherein the flexible printed circuit board includes: a first wire comprising a first signal circuit formed along a first length direction; a second wire comprising a second signal circuit formed along a second length direction; a bonding sheet configured to bond the first wire and the second wire along a bonding area; and one or more signal vias penetrating the first wire and the second wire and configured to electrically connect the first signal circuit to the second signal circuit.

The first wire may include a first board surface and a second board surface opposite to the first board surface, the second wire may include a third board surface and a fourth board surface opposite to the third board surface, and at the bonding area, the first board surface and the third board surface may face each other with the bonding sheet therebetween, the first board surface and the third board surface may each have a shape corresponding to a shape of the bonding sheet.

The flexible printed circuit board may further include a first cover overlapping the bonding sheet on at least a portion of the second board surface, and a second cover overlapping with the bonding sheet on at least a portion of the fourth board surface.

The flexible printed circuit board may further include one or more dummy vias penetrating the first cover and the second cover.

The one or more dummy vias may be adjacent to the first signal circuit and the second signal circuit in a width direction perpendicular to the first length direction.

Each of the first cover and the second cover may include a first cover portion overlapping with the bonding sheet, and a second cover portion extending from the first cover portion in the first length direction and the second length direction.

The electronic device may further include a plurality of dummy vias penetrating the first cover and the second cover, the plurality of dummy vias may include a plurality of first dummy vias on the first cover portion, and a plurality of second dummy vias on the second cover portion.

Each of the plurality of first dummy vias may be on both sides of the one or more signal vias along a width direction perpendicular to the first length direction.

Each of the first cover and the second cover may include a first cover portion overlapping with the bonding sheet and forming the bonding area, and a pair of third cover portions each extending to both sides of the first cover portion along a width direction perpendicular to the first length direction.

The electronic device may further include a plurality of dummy vias penetrating the first cover and the second cover, the plurality of dummy vias may include a plurality of first dummy vias on the first cover portion, and a plurality of third dummy vias on the pair of third cover portions.

Each of the first cover and the second cover may have a shape corresponding to a shape of the bonding sheet and overlap with the bonding sheet, and the flexible printed circuit board may further include a plurality of dummy vias penetrating the first cover and the second cover and enclosing a circumference of the one or more signal vias.

The flexible printed circuit board may further include a first connector connected to a first end of the first wire opposite to the bonding area based on the first length direction, and a second connector connected to a second end of the second wire opposite to the bonding area based on the second length direction.

The first wire is between the first connector and the bonding area and may include a first bending portion of which at least a portion may partially bend, and the second wire may be formed between the second connector and the bonding area and include a second bending portion of which at least a portion partially bends.

The flexible printed circuit board may further include a first rigid member on at least a portion of a surface of the first wire and may be configured to reinforce a rigidity of the first wire, and a second rigid member on at least a portion of a surface of the second wire and may be configured to reinforce a rigidity of the second wire.

The bonding sheet may be formed of a material having a rigidity greater than a material of each of the first wire and the second wire.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
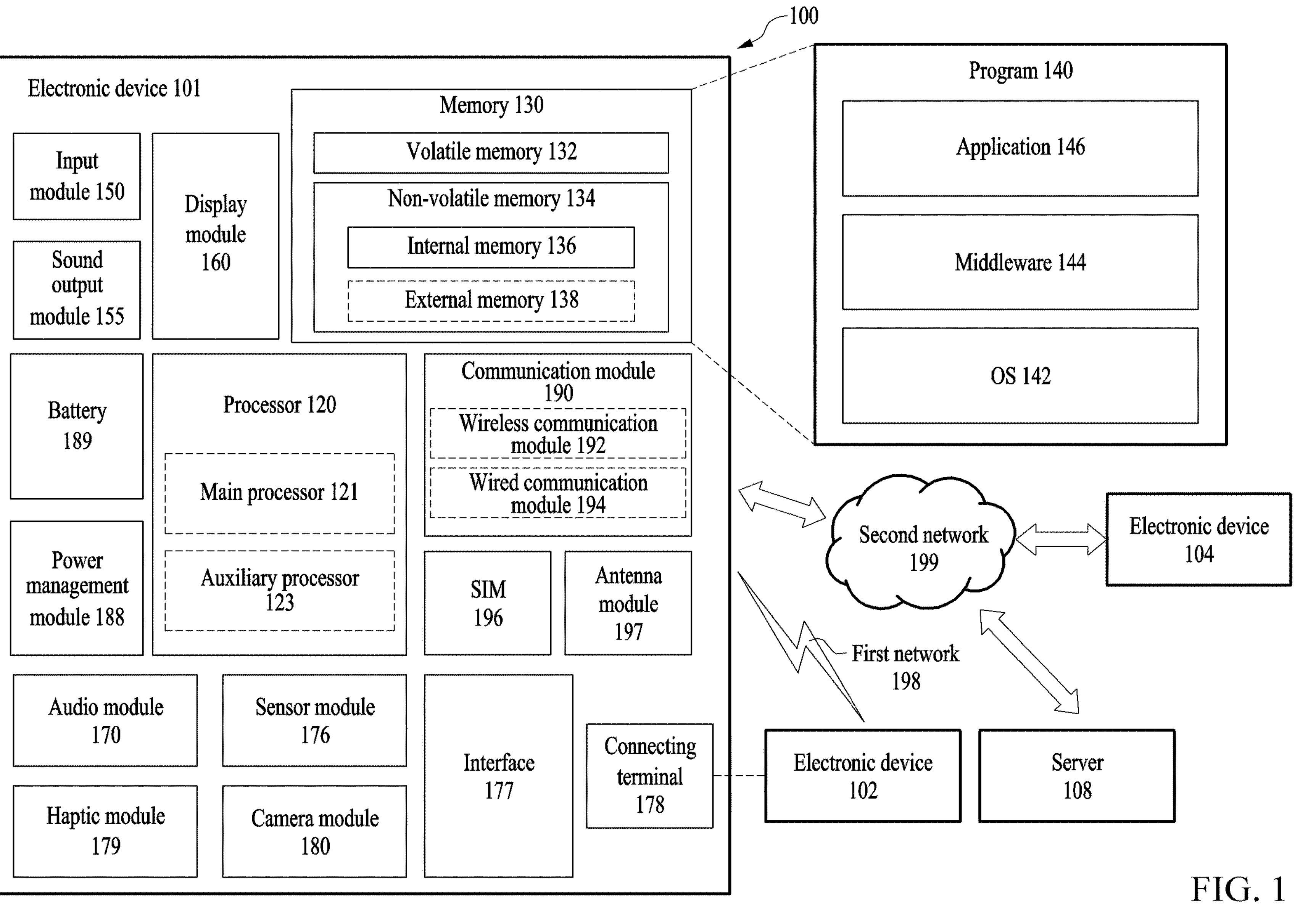
FIG. 1 is a block diagram illustrating an electronic device in a network environment, according to one or more embodiments.

Hereinafter, one or more embodiments will be described in detail with reference to the accompanying drawings. When describing the one or more embodiments with reference to the accompanying drawings, like reference numerals refer to like elements and a repeated description related thereto will be omitted.

FIG. 1 is a block diagram illustrating an electronic device in a network environment according to one or more embodiments. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an one or more embodiments, the electronic device 101 may communicate with the electronic device 104 via the server 108. According to one or more embodiments, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In one or more embodiments, at least one (e.g., the connecting terminal 178) of the above components may be omitted from the electronic device 101, or one or more other components may be added in the electronic device 101. In one or more embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120 and may perform various data processing or computation. According to one or more embodiments, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to one or more embodiments, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. In a state in which the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101 instead of the main processor 121 while the main processor 121 is in an inactive (e.g., sleep) state or along with the main processor 121 while the main processor 121 is an active state (e.g., executing an application). According to one or more embodiments, the auxiliary processor 123 (e.g., an ISP or a CP) may be implemented as a portion of another component (e.g., the camera module 180 or the communication module 190) that is functionally related to the auxiliary processor 123. According to one or more embodiments, the auxiliary processor 123 (e.g., an NPU) may include a hardware structure specified for artificial intelligence (AI) model processing. An AI model may be generated by machine learning. The machine learning may be performed by, for example, the electronic device 101, in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), and a deep Q-network or a combination of two or more thereof but is not limited thereto. The AI model may additionally or alternatively include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include a microphone, a mouse, a keyboard, a key (e.g., a button), or a digital pen (e.g., a stylus pen).

The sound output module 155 may output a sound signal to the outside of the electronic device 101. The sound output module 155 may include a speaker or a receiver. The speaker may be used for general purposes, such as playing multimedia or playing a recording. The receiver may be used to receive an incoming call. According to one or more embodiments, the receiver may be implemented separately from the speaker or as a part of the speaker.

The display module 160 may visually provide information to the outside (e.g., a user) of the electronic device 101. The display module 160 may include a control circuit for controlling a display, a hologram device, or a projector and control circuitry to control a corresponding one of the display, the hologram device, and the projector. According to one or more embodiments, the display device 160 may include a touch sensor adapted to sense a touch or a pressure sensor adapted to measure the intensity of a force incurred by the touch.

The audio module 170 may convert a sound into an electric signal or vice versa. According to one or more embodiments, the audio module 170 may obtain the sound via the input module 150 or may output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101 and may generate an electric signal or data value corresponding to the detected state. According to one or more embodiments, the sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to one or more embodiments, the interface 177 may include a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to one or more embodiments, the connecting terminal 178 may include an HDMI connector, a USB connector, an SD card connector, or an audio connector (e.g., a headphone connector).

The haptic module 179 may convert an electric signal into a mechanical stimulus (e.g., a vibration or a movement) or an electrical stimulus, which may be recognized by a user via their tactile sensation or kinesthetic sensation. According to one or more embodiments, the haptic module 179 may include a motor, a piezoelectric element, or an electric stimulator.

The camera module 180 may capture a still image and moving images. According to one or more embodiments, the camera module 180 may include one or more lenses, image sensors, ISPs, or flashes.

The power management module 188 may manage power supplied to the electronic device 101. According to one or more embodiments, the power management module 188 may be implemented as at least a part of a power management integrated circuit (PMIC).

The battery 189 may supply power to at least one component of the electronic device 101. According to one or more embodiments, the battery 189 may include a primary cell that is not rechargeable, a secondary cell that is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., an AP) and that support direct (e.g., wired) communication or wireless communication. According to one or more embodiments, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide region network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large-scale antenna. The wireless communication module 192 may support various requirements specified in the electronic device 101, an external electronic device (e.g., the electronic device 104), or a network system (e.g., the second network 199). According to one embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to one or more embodiments, the antenna module 197 may include an antenna including a radiating element including a conductive material or a conductive pattern formed in or on a substrate (e.g., a printed circuit board (PCB)). According to one or more embodiments, the antenna module 197 may include a plurality of antennas (e.g., array antennas). In such a case, at least one antenna appropriate for a communication scheme used in a communication network, such as the first network 198 or the second network 199, may be selected by the communication module 190 from the plurality of antennas. The signal or power may be transmitted or received between the communication module 190 and the external electronic device via the at least one selected antenna. According to one or more embodiments, another component (e.g., a radio frequency integrated circuit (RFIC)) other than the radiating element may be additionally formed as a part of the antenna module 197.

According to one or more embodiments, the antenna module 197 may form a mmWave antenna module. According to one or more embodiments, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and exchange signals (e.g., commands or data) therebetween via an inter-peripheral communication scheme (e.g., a bus, general purpose input and output (GPIO), serial peripheral interface (SPI), or mobile industry processor interface (MIPI)).

According to one or more embodiments, commands or data may be transmitted or received between the electronic device 101 and the external electronic device 104 via the server 108 coupled with the second network 199. Each of the external electronic devices (e.g., the electronic device 102 or 104) may be a device of the same type as or a different type from the electronic device 101. According to one or more embodiments, all or some of operations to be executed by the electronic device 101 may be executed at one or more external electronic devices (e.g., the external devices 102 and 104, and the server 108). If the electronic device 101 needs to perform a function or a service automatically, or in response to a request from a user or another device, the electronic device 101, instead of, or in addition to, executing the function or the service, may request the one or more external electronic devices to perform at least part of the function or service. The one or more external electronic devices receiving the request may perform the at least part of the function or service, or an additional function or an additional service related to the request and may transfer a result of the performance to the electronic device 101. The electronic device 101 may provide the result, with or without further processing the result, as at least part of a response to the request. To that end, cloud computing, distributed computing, mobile edge computing (MEC), or client-server computing technology may be used. The electronic device 101 may provide ultra-low-latency services using, e.g., distributed computing or MEC. According to one or more embodiments, the external electronic device 104 may include an Internet-of-things (IoT) device. The server 108 may be an intelligent server using machine learning and/or a neural network. According to one or more embodiments, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to one or more embodiments may be one of various types of electronic devices. The electronic device may include a portable communication device (e.g., a smartphone), a computer device, a portable multimedia device, a portable medical device, a camera, a wearable device, or a home appliance device. According to one or more embodiments, the electronic device is not limited to those described above.

One or more embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via a third element.

As used in connection with one or more embodiments, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. According to one or more embodiments, the module may be implemented in a form of an application-specific integrated circuit (ASIC).

One or more embodiments as set forth herein may be implemented as software (e.g., the program 140) including one or more instructions that are stored in a storage medium (e.g., an internal memory 136 or an external memory 138) that is readable by a machine (e.g., the electronic device 101) A processor (e.g., the processor 120) of the machine (e.g., the electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to one or more embodiments may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as a memory of the manufacturer's server, a server of the application store, or a relay server.

According to one or more embodiments, each component (e.g., a module or a program) of the above-described components may include a single entity or multiple entities, and some of the multiple entities may be separately disposed in different components. According to one or more embodiments, one or more of the above-described components may be omitted, or one or more other components may be added. Alternatively or additionally, a plurality of components (e.g., modules or programs) may be integrated into a single component. In such a case, according to one or more embodiments, the integrated component may still perform one or more functions of each of the components in the same or similar manner as they are performed by a corresponding one among the components before the integration. According to one or more embodiments, operations performed by the module, the program, or another component may be carried out sequentially, in parallel, repeatedly, or heuristically, or one or more of the operations may be executed in a different order or omitted, or one or more other operations may be added.

Figure 2A:
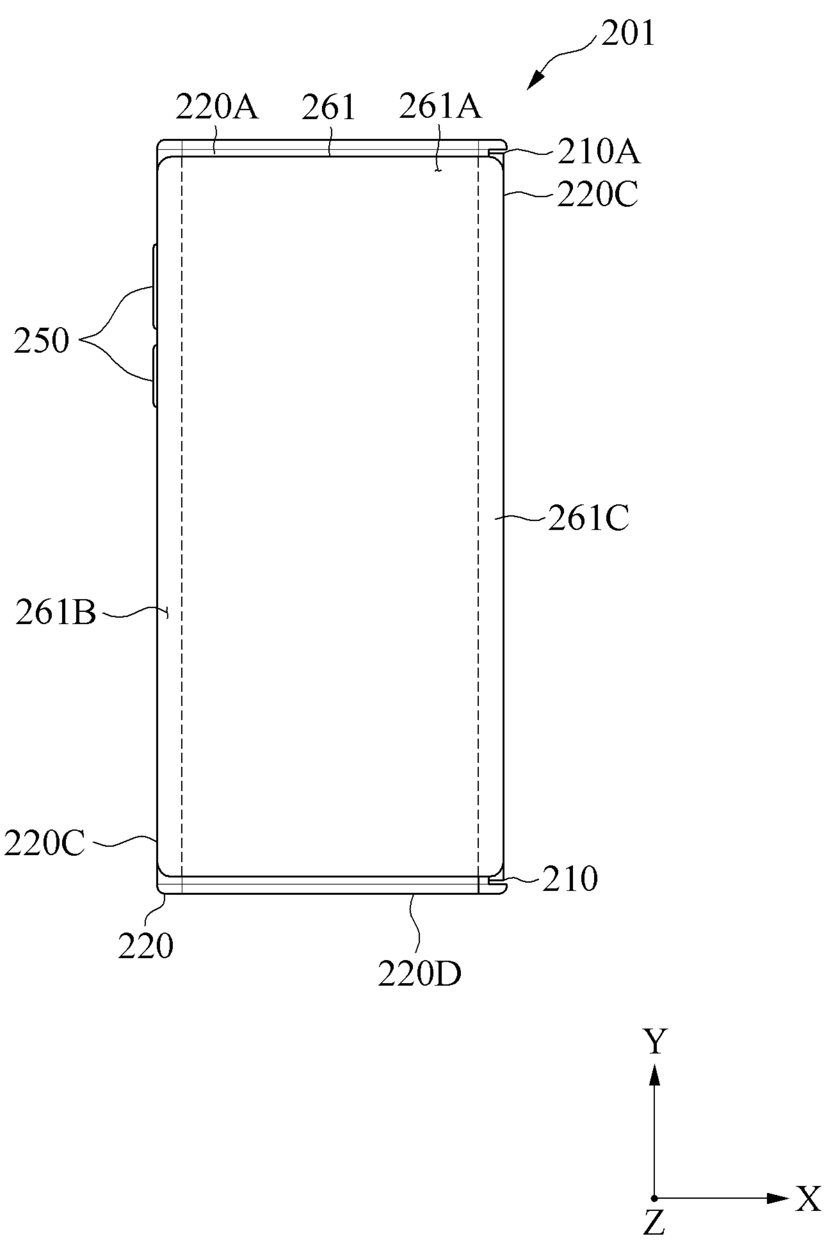
FIG. 2A is a front view of a first state of an electronic device according to one or more embodiments.
Figure 2B:
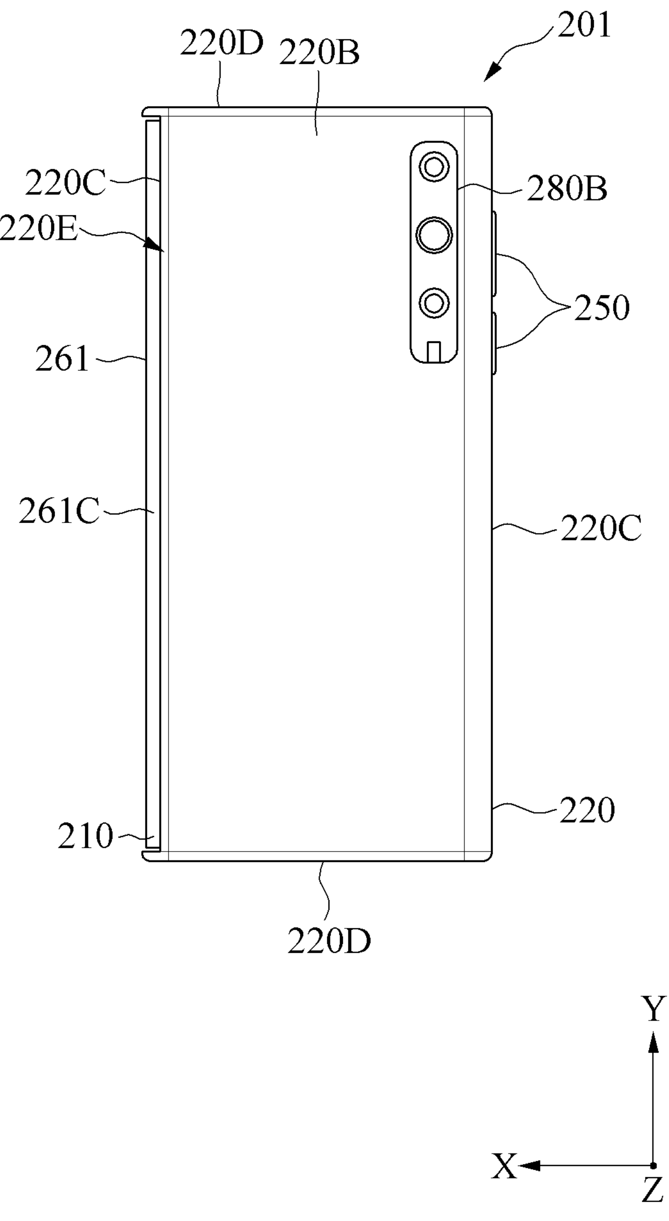
FIG. 2B is a rear view of the first state of the electronic device according to one or more embodiments.
Figure 2C:
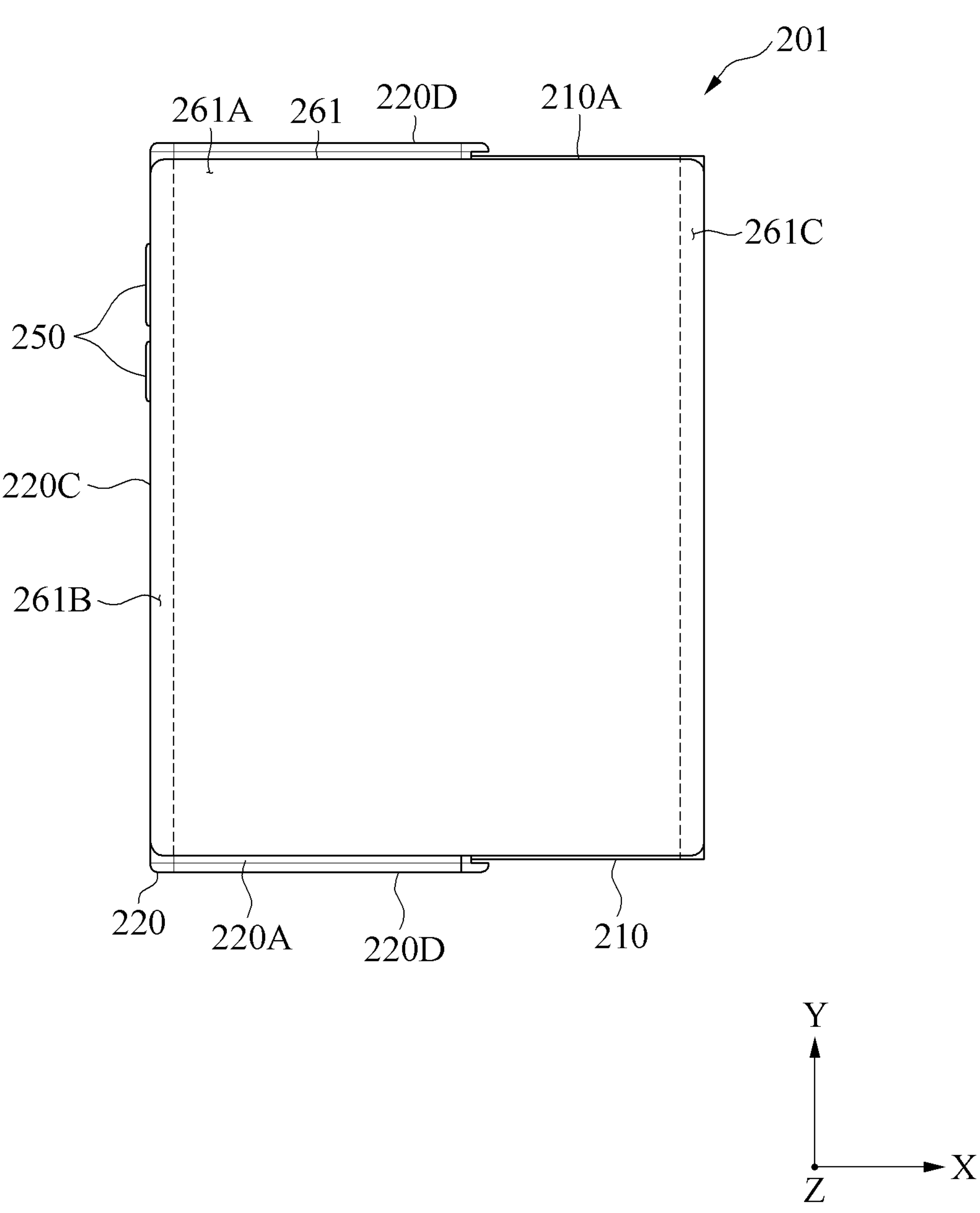
FIG. 2C is a front view of a second state of the electronic device according to one or more embodiments.
Figure 2D:
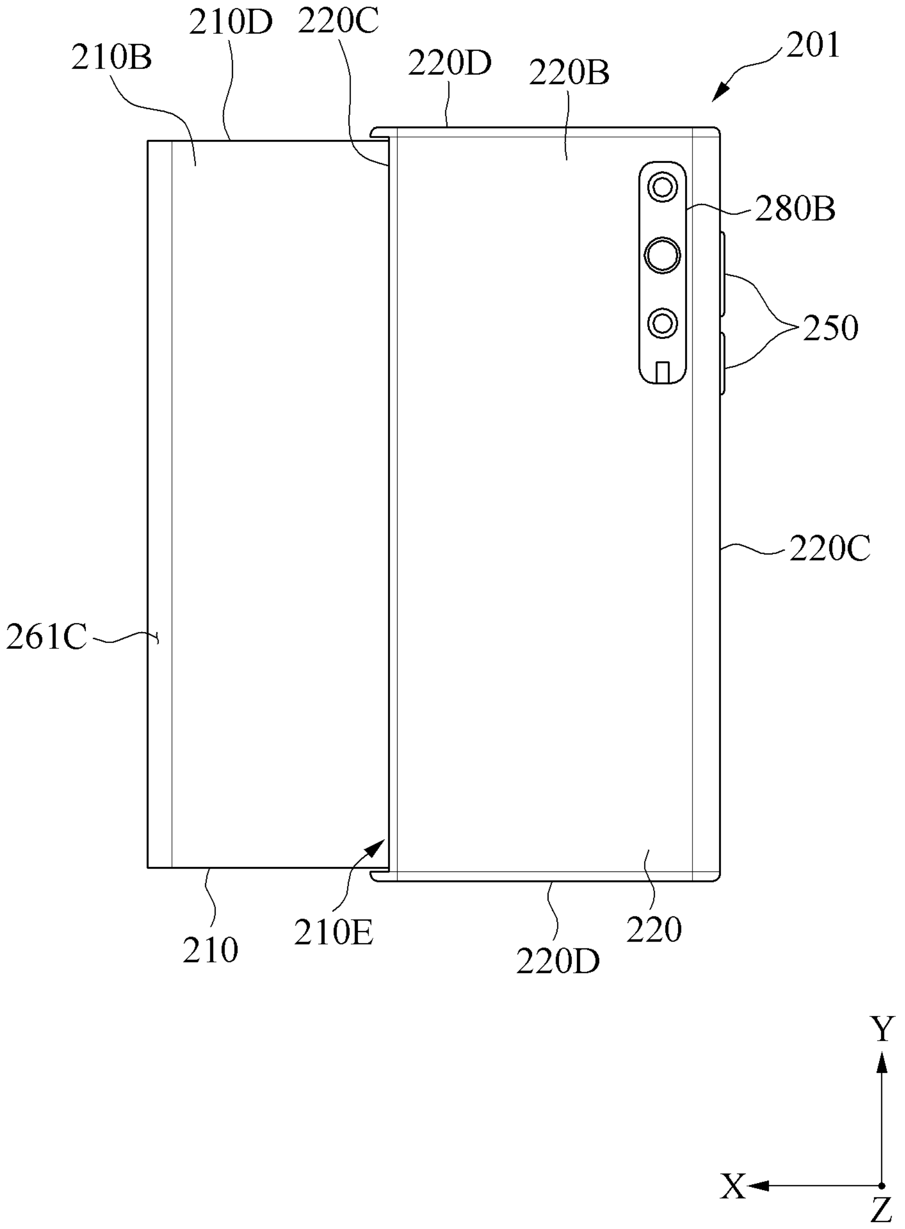
FIG. 2D is a rear view of the second state of the electronic device according to one or more embodiments.
Figure 2E:
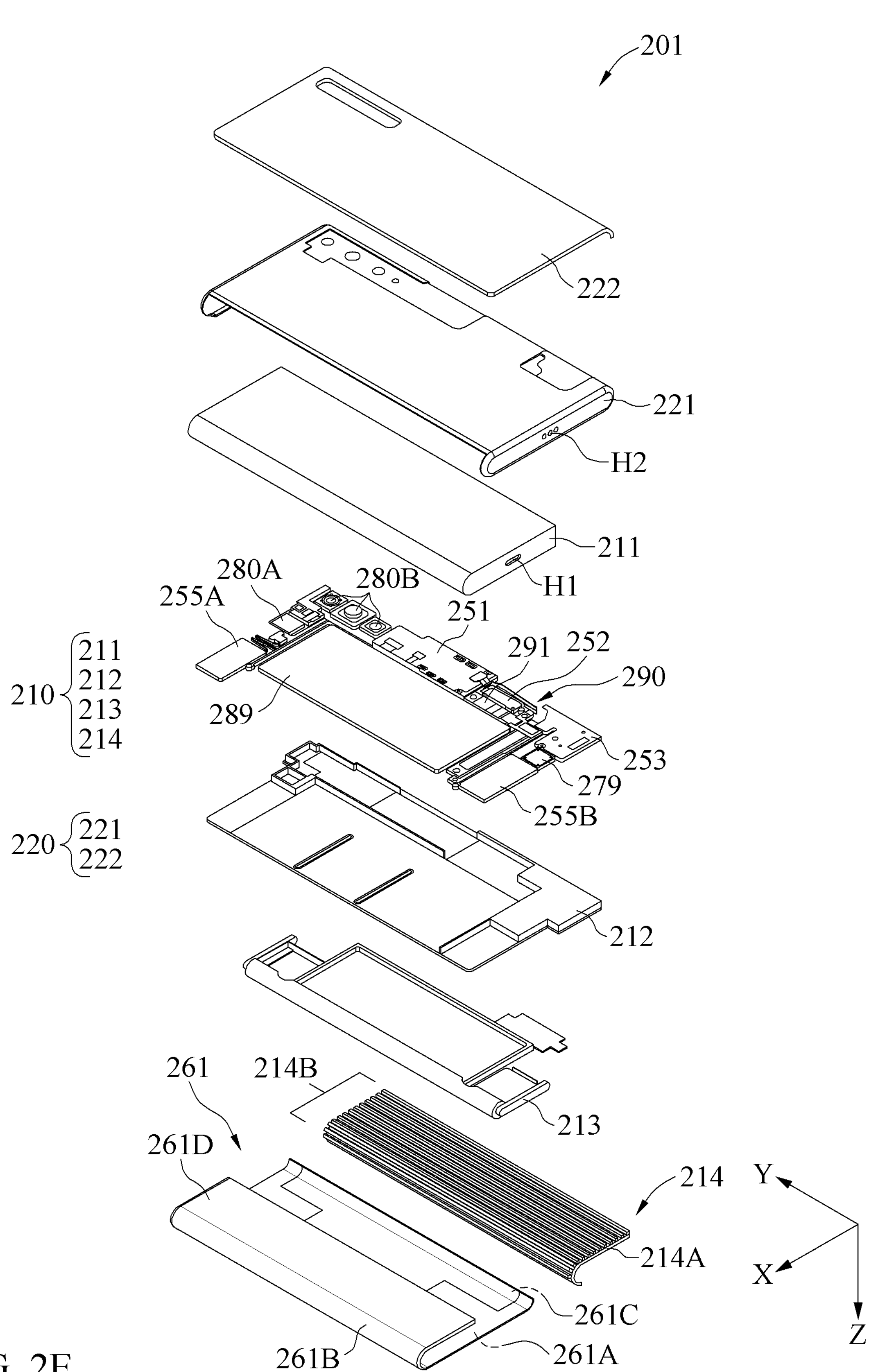
FIG. 2E is an exploded perspective view of the electronic device according to one or more embodiments.

FIG. 2A is a front view of a first state of an electronic device according to one or more embodiments, FIG. 2B is a rear view of the first state of the electronic device according to one or more embodiments, FIG. 2C is a front view of a second state of the electronic device according to one or more embodiments, FIG. 2D is a front view of the second state of the electronic device according to one or more embodiments, and FIG. 2E is an exploded perspective view of the electronic device according to one or more embodiments.

Referring to FIGS. 2A through 2E, an electronic device 201 (e.g., the electronic device 101 of FIG. 1) according to one or more embodiments may include housings 210 and 220 that form an exterior and accommodate components inside. According to one or more embodiments, the housings 210 and 220 may include a first housing 210 and a second housing 220 that are partially connected to be movable to each other.

The first housing 210 and the second housing 220 may be relatively movably connected along a moving direction (e.g., an X-axis direction). According to one or more embodiments, the second housing 220 may be connected to move relative to the first housing 210 in a first direction (e.g., a −X-axis direction) or move relative to the first housing 210 in a second direction (e.g., a +X-axis direction) that is opposite to the first direction. In addition, the operations of the second housing 220 moving relative to the first housing 210 are provided for ease of description, the relative movement of the first housing 210 and the second housing 220 is not limited to the one or more embodiments. In addition, although the second housing 220 moving along the X-axis direction relative to the first housing 210 is illustrated in the drawing, the relative movement direction of the first housing 210 and the second housing 220 is not limited to the one or more embodiments illustrated in the drawing. The first housing 210 and the second housing 220 may be connected to be relatively movable along the Y-axis direction or may be connected to be movable along both X-axis and Y-axis directions. Hereinafter, for ease of description, the relative movement of the first housing 210 and the second housing 220 is described as the second housing 220 moves along the moving direction relative to the first housing 210.

According to one or more embodiments, the first housing 210 may include a first surface 210A (e.g., a first front surface), a second surface 210B (e.g., a first rear surface) opposite to the first surface 210A, a plurality (e.g., two) of first side surfaces 210C (e.g., a first left side surface and a first right side surface) oriented in a direction (e.g., the +/−X direction) and positioned between the first surface 210A and the second surface 210B, and a plurality (e.g., two) of second side surfaces 210D (e.g., a first upper side surface and a first lower side surface) oriented in another direction (e.g., the +/−Y direction) intersecting with the direction (e.g., the +/−X direction) and positioned between the first surface 210A and the second surface 210B. According to one or more embodiments, the plurality of first side surfaces 210C may be formed of rounded surfaces. According to one or more embodiments, the first housing 210 may include at least one first hole H1 formed on a second side surface 210D (e.g., the first lower side surface) oriented in one direction (e.g., the −Y direction), of the second side surfaces 210D.

The second housing 220 may include a third surface 220A (e.g., a second front surface), a fourth surface 220B (e.g., a second rear surface) opposite to the third surface 220A, a plurality (e.g., two) of third side surfaces 220C (e.g., a second left side surface and a second right side surface) oriented in a direction (e.g., the +/−X direction) and positioned between the third surface 220A and the fourth surface 220B, and a plurality (e.g., two) of fourth side surfaces 220D (e.g., a second upper side surface and a second lower side surface) oriented in another direction (e.g., the +/−Y direction) intersecting with the direction (e.g., the +/−X direction) and positioned between the third surface 220A and the fourth surface 220B. Among the plurality of third side surfaces 220C, a third side surface 220C oriented in one direction (e.g., the +X direction) may include an open portion 220E that is at least partially open. The plurality of third side surfaces 220C may be formed of rounded surfaces. The second housing 220 may include at least one second hole H2 formed on the fourth side surface 220D (e.g., the second lower side surface) oriented in a direction (e.g., the −Y direction) among the plurality of fourth side surfaces 220D. The second hole H2 may be aligned with the first hole H1.

According to one or more embodiments, the electronic device 201 may include a display 261 (e.g., the display module 160 of FIG. 1) for displaying visual information. The display 261 may be supported by the first housing 210 and the second housing 220 and may include display areas 261A, 261B, 261C, and 261D that are visually exposed to the outside. According to one or more embodiments, the display 261 may be any of a flexible display, a foldable display, or a rollable display.

According to one or more embodiments, the display areas 261A, 261B, 261C, and 261D may include a first area 261A on the first surface 210A and the third surface 220A, a second area 261B on the third side surface 220C oriented in a direction (e.g., the −X direction) among the third side surfaces 220C, a third area 261C on the third side surface 220C oriented in another direction (e.g., the +X direction) among the third side surfaces 220C and at least partially enclosing the open portion 220E, and a fourth area 261D on the second surface 210B and the fourth surface 220B.

According to one or more embodiments, the second area 261B and the third area 261C of the display 261 may have flexibly curved round surfaces. According to one or more embodiments, the second area 261B may be partially on the first surface 210A and the third surface 220A. The third area 261C may be partially on the first surface 210A and the third surface 220A. According to one or more embodiments, the third area 261C may be partially on the second surface 210B and the fourth surface 220B.

According to one or more embodiments, the display 261 may be configured to partially display a screen. The display 261 may display the screen through the first area 261A positioned on the first surface 210A and the third surface 220A, and the second area 261B, the third area 261C, and/or the fourth area 261D may display the screen from points of view different from that of the first area 261A. According to one or more embodiments, the display area of the display 261 may expand or may be reduced as the first housing 210 moves in the first direction and the second direction. Depending on the relative movement of the first housing 210 and the second housing 220, the display 261 may change in an area of the display area between a reduced state (e.g., the first state of FIG. 2B) and an expanded state (the second state of FIG. 2D), in which the area of the display area is minimized in the reduced state and the area of the display area is maximized in the expanded state.

According to one or more embodiments, when viewed in one direction (e.g., the −Z direction), the electronic device 201 may change in states between the first state (e.g., the reduced state of FIG. 2B) having the display area (e.g., the first area 261A, the second area 261B, and the third area 261C) of a first size and the second state (e.g., the expanded state of FIG. 2D) having the display area (e.g., the first area 261A, the second area 261B, and the third area 261C) of a second size greater than the first size. In a state in which the first housing 210 moves relative to the second housing 220 in the first direction (e.g., the +X direction) in the first state, the display area of the display 261 viewed from the direction (e.g., the −Z direction) may expand as the size of the first area 261A increases and the size of the fourth area 261D decreases. On the other hand, in the second state, when the second housing 220 moves relative to the first housing 210 in the second direction (e.g., the −X direction) opposite to the first direction, the size of the first area 261A may decrease and the size of the fourth area 261D may increase. Meanwhile, while the electronic device 201 operates between the first state and the second state, the size of the second area 261B and the size of the third area 261C may be substantially constant.

According to one or more embodiments, the electronic device 201 may include a slide device 290 including a drive device 291 configured to move the first housing 210 and the second housing 220 relative to each other. The slide device 290 may be connected to the first housing 210 and the second housing 220 and may slide one of the first housing 210 and the second housing 220 relative to the other housing 210 or 220. As the first housing 210 or the second housing 220 moves, the display may expand or may be reduced.

According to one or more embodiments, the electronic device 201 may include an input module 250 (e.g., the input module 150 of FIG. 1). The input module 250 may be formed on a third side surface 220C (e.g., the second left side surface) where the open portion 220E is not formed, of the plurality of third side surfaces 220C.

According to one or more embodiments, the electronic device 201 may include a first sound output module 255A (e.g., the sound output module 155 of FIG. 1) and a second sound output module 255B (e.g., the sound output module 155 of FIG. 1). According to one or more embodiments, the first sound output module 255A may be on a first portion (e.g., an upper portion) of the first housing 210 and the second sound output module 255B may be on a second portion (e.g., a lower portion) different from the first portion of the first housing 210.

According to one or more embodiments, in the first state (e.g., the reduced state of the electronic device 201 of FIG. 2A), the first sound output module 255A may be configured to function as a transmitter/receiver and the second module 255B may be configured to function as a speaker, whereas in the second state (e.g., the expanded state of the electronic device 201 of FIG. 2B), the first sound output module 255A and the second sound output module 255B may be configured to function as a speaker. According to one or more embodiments, in the second state, the first sound output module 255A and the second sound output module 255B may output stereo sound in cooperation with each other.

According to one or more embodiments, in the first state, the second sound output module 255B may be configured to radiate sound through the first hole H1 and the second hole H2 substantially aligned with each other, and in the second state, the second sound output module 255B may be configured to radiate sound through the first hole H1. In an embodiment, at least one of the first sound output module 255A and the second sound output module 255B may be in the second housing 220. According to one or more embodiments, the electronic device 201 may include only one of the first sound output module 255A and the second sound output module 255B or may further include an additional sound output module in addition to the shown sound output modules.

According to one or more embodiments, the electronic device 201 may include a haptic module 279 (e.g., the haptic module 179 of FIG. 1). The haptic module 279 may include a vibrator configured to generate vibrations. According to one or more embodiments, the haptic module 279 may be in the second housing 220. According to one or more embodiments, the haptic module 279 may be adjacent to the second sound output module 255B. According to one or more embodiments, the haptic module 279 may be in the first housing 210.

According to one or more embodiments, the electronic device 201 may include a first camera module 280A (e.g., the camera module 180 of FIG. 1) and a second camera module 280B (e.g., the camera module 180 of FIG. 1). The first camera module 280A may be configured to obtain an image of one direction (e.g., the +Z direction) of the electronic device 201, and the second camera module 280B may be configured to obtain an image of the other direction (e.g., the −Z direction) of the electronic device 201.

According to one or more embodiments, the first camera module 280A and the second camera module 280B may be in the second housing 220. According to one or more embodiments, at least one of the first camera module 280A and the second camera module 280B may be in the first housing 210. According to one or more embodiments, the electronic device 201 may include only one of the first camera module 280A and the second camera module 280B or may further include an additional camera module in addition to the shown camera modules.

According to one or more embodiments, the electronic device 201 may include a battery 289 (e.g., the battery 189 of FIG. 1). According to one or more embodiments, the battery 289 may be in the first housing 210. The battery 289 may be at least partially enclosed by, according to one or more embodiments, the first sound output module 255A, the first camera module 280A, the second camera module 280B, a first PCB 251, the slide device 300, a third PCB 253, the haptic module 279, and the second sound output module 255B. According to one or more embodiments, the battery 289 may be in the second housing 220.

According to one or more embodiments, the electronic device 201 may include the first PCB 251, a second PCB 252, and the third PCB 253. The first PCB 251, the second PCB 252, and the third PCB 253 may include a plurality of metal layers and a plurality of dielectrics each positioned between a pair of adjacent metal layers. The first PCB 251 may be in the second housing 220. The first PCB 251 may include a first electronic component 288 (e.g., the power management module 188 of FIG. 1). The second PCB 252 may be in the first housing 210. According to one or more embodiments, the second PCB 252 may be electrically connected to the slide device 300. The third PCB 253 may be in the second housing 220. The third PCB 253 may be electrically connected, according to one or more embodiments, to the haptic module 279.

According to one or more embodiments, the electronic device 201 may include a structure forming the housings 210 and 220. According to one or more embodiments, the electronic device 201 may include a first cover 211, a first plate 212, a second plate 213, and a support structure 214, which form the first housing 210, and may include a second cover 221 and a third plate 222, which form the second housing 220. The second plate 213 may connect the first plate 212 to the third plate 222 and may be connected slidably along the moving direction (e.g., the X-axis direction of FIG. 2C) relative to the first plate 212 or the third plate 222 depending on the relative movement of the second housing 220 to the first housing 210.

According to one or more embodiments, the first cover 211 may partially enclose the first sound output module 255A, the first camera module 280A, the haptic module 279, and the second sound output module 255B. The first plate 212 may at least partially accommodate electronic components (e.g., the slide device 300, the first sound output module 255A, the second sound output module 255B, the first camera module 280A, the second camera module 280B, the first PCB 251, the second PCB 252, the third PCB 253, a connector assembly 290, the haptic module 279, and other electronic components). The second plate 213 may be positioned between the first plate 212 and the display 261 to support the slide device 300 and the display 261.

The support structure 214 may include a base plate 214B configured to flexibly bend and a plurality of support bars 214B arranged along the base plate 214A to be spaced apart from each other and configured to support the display 261. The second cover 221 may be slidably connected to the first cover 211 to enclose the first cover 211 at least partially and slide the first cover 211 relative to the second cover 221.

The second cover 221 may be configured to guide the plurality of support bars 214B. The second cover 221 may expose at least a portion (e.g., the second camera module 280B) of the electronic component to the outside of the electronic device 201. The third plate 222 may enclose at least a portion of the second cover 221. The third plate 222 may be formed of, according to one or more embodiments, a glass material. Meanwhile, the structures of the first housing 210 and the second housing 220 described herein are not limited to the one or more embodiments, and there may be various shapes of structures.

Figure 3A:
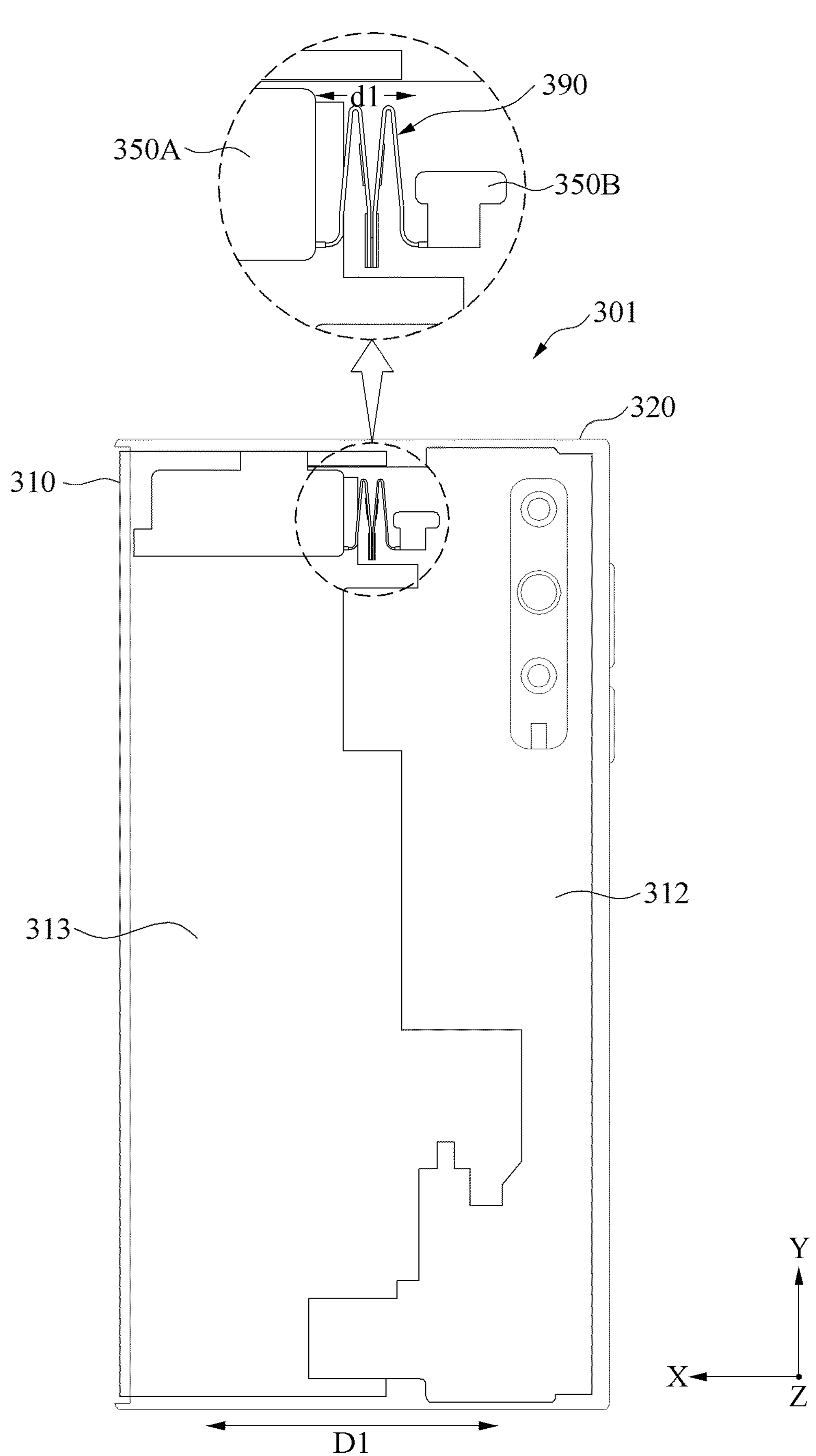
FIG. 3A is a diagram illustrating a state of a flexible printed circuit board in the first state of the electronic device according to one or more embodiments.
Figure 3B:
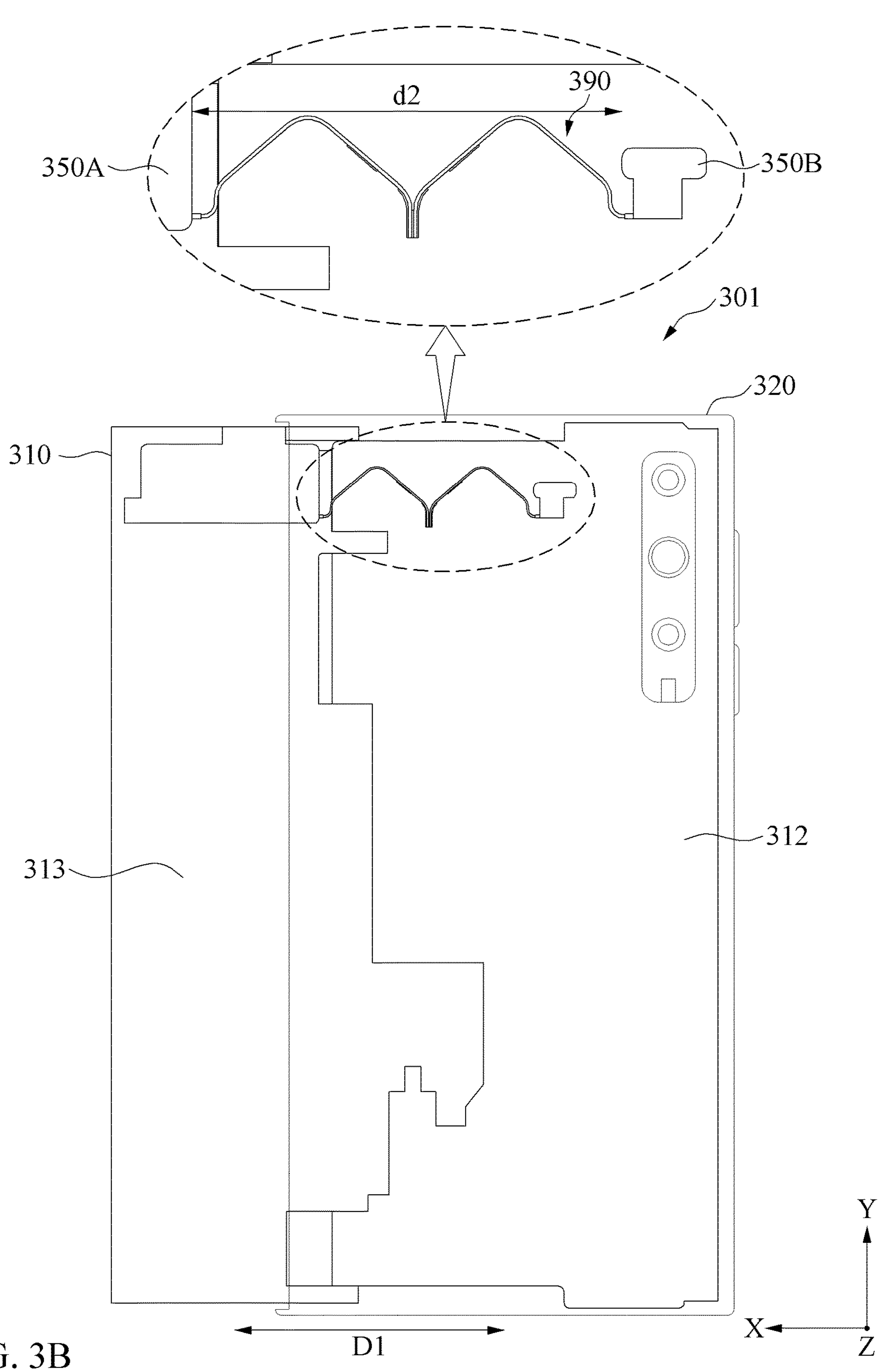
FIG. 3B is a diagram illustrating a state of the flexible printed circuit board in the second state of the electronic device according to one or more embodiments.

FIG. 3A is a diagram illustrating a state of a flexible printed circuit board in the first state of the electronic device according to one or more embodiments, and FIG. 3B is a diagram illustrating a state of the flexible printed circuit board in the second state of the electronic device according to one or more embodiments.

Referring to FIGS. 3A and 3B, an electronic device 301 according to one or more embodiments may include a first housing 310, a second housing 320, and a flexible printed circuit board 390.

According to one or more embodiments, the first housing 310 and the second housing 320 may form an exterior of the electronic device 301. According to one or more embodiments, the first housing 310 and the second housing 320 may be partially movably connected in a moving direction D1 (e.g., an X-axis direction). According to one or more embodiments, in the process of changing the state of the electronic device 301 (e.g., the process of changing between the first state of FIG. 3A and the second state of FIG. 3B), the second housing 320 may move relative to the first housing 310 in the moving direction D1.

According to one or more embodiments, a first plate 313 may be inside the first housing 310 and a second plate 312 may be inside the second housing 320. The first plate 313 and the second plate 312 may change in a relative distance depending on a state change of the electronic device 301, according to one or more embodiments, the relative movement of the first housing 310 and the second housing 320. One or more components for performing functions of the electronic device 301 may be on the first plate 313 and the second plate 312. According to one or more embodiments, a first component 350A may be on the first plate 313 and a second component 350B may be on the second plate 312.

According to one or more embodiments, the flexible printed circuit board 390 may be inside the electronic device 301. According to one or more embodiments, the flexible printed circuit board 390 may electrically connect a plurality of components inside the electronic device 301. According to one or more embodiments, both ends of the flexible printed circuit board 390 may be connected respectively to the first component 350A (e.g., the first sound output module 255) inside the first housing 310 and the second component 350B (e.g., the first camera module 280A) inside the second housing 320 and may electrically connect the first component 350A to the second component 350B. According to one or more embodiments, the length of the flexible printed circuit board 390 may change in the moving direction D1 depending on the relative movement of the first housing 310 and the second housing 320. According to one or more embodiments, in a state in which the flexible printed circuit board 390 connects the first component 350A to the second component 350B, the flexible printed circuit board 390 may be partially bent or unfolded and may cause a change in the length in the moving direction D1 correspondingly to a gap between the first component 350A and the second component 350B depending on the state of the electronic device 301. According to one or more embodiments, based on the length in the moving direction D1, the flexible printed circuit board 390 may have a first length d1 in the first state (e.g., a folded state of FIG. 3A) of the electronic device and may have a second length d2 in the second state (e.g., an unfolded state of FIG. 3B) of the electronic device.

Figure 4A:
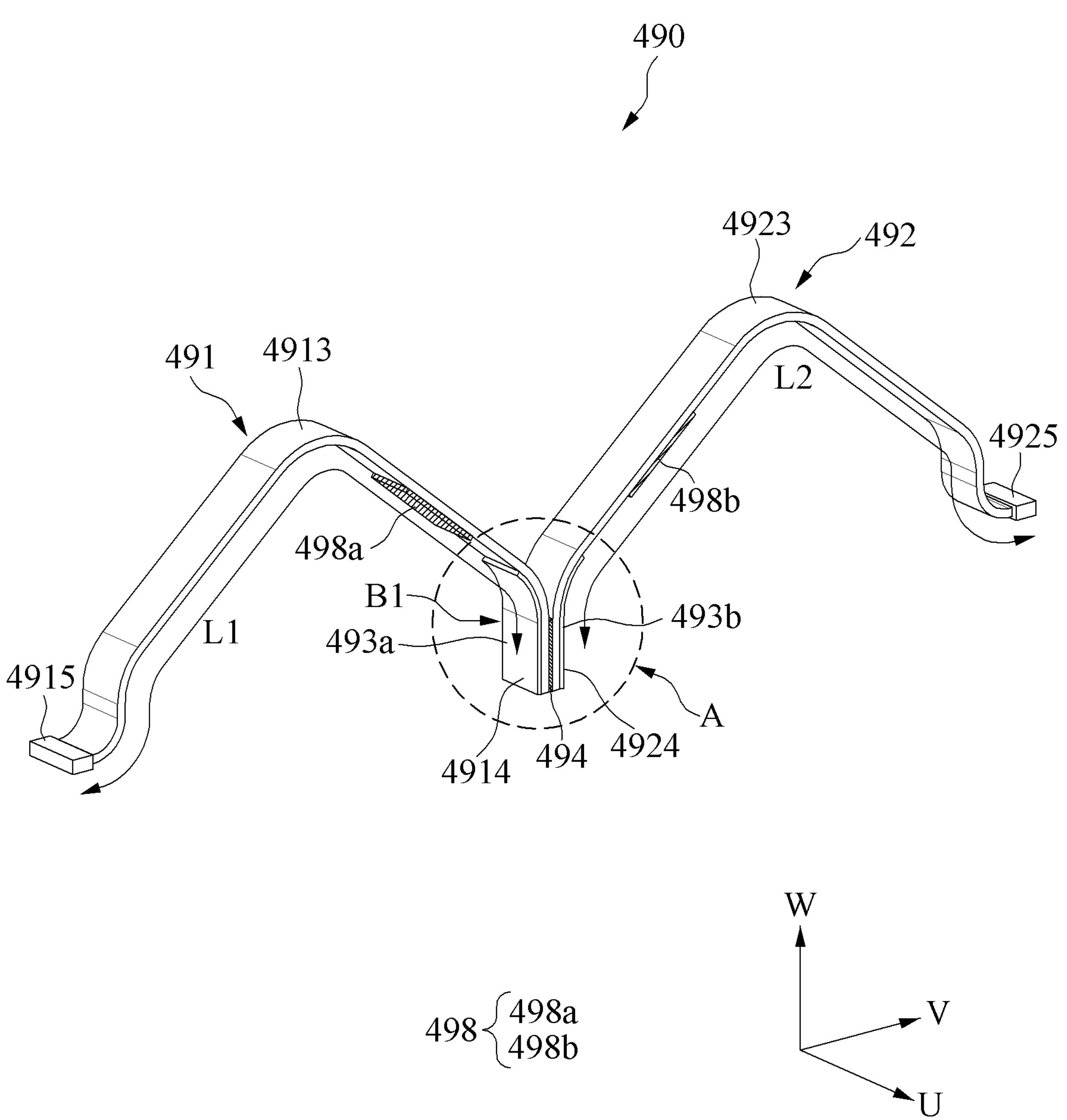
FIG. 4A is a perspective view of the flexible printed circuit board according to one or more embodiments.
Figure 4B:
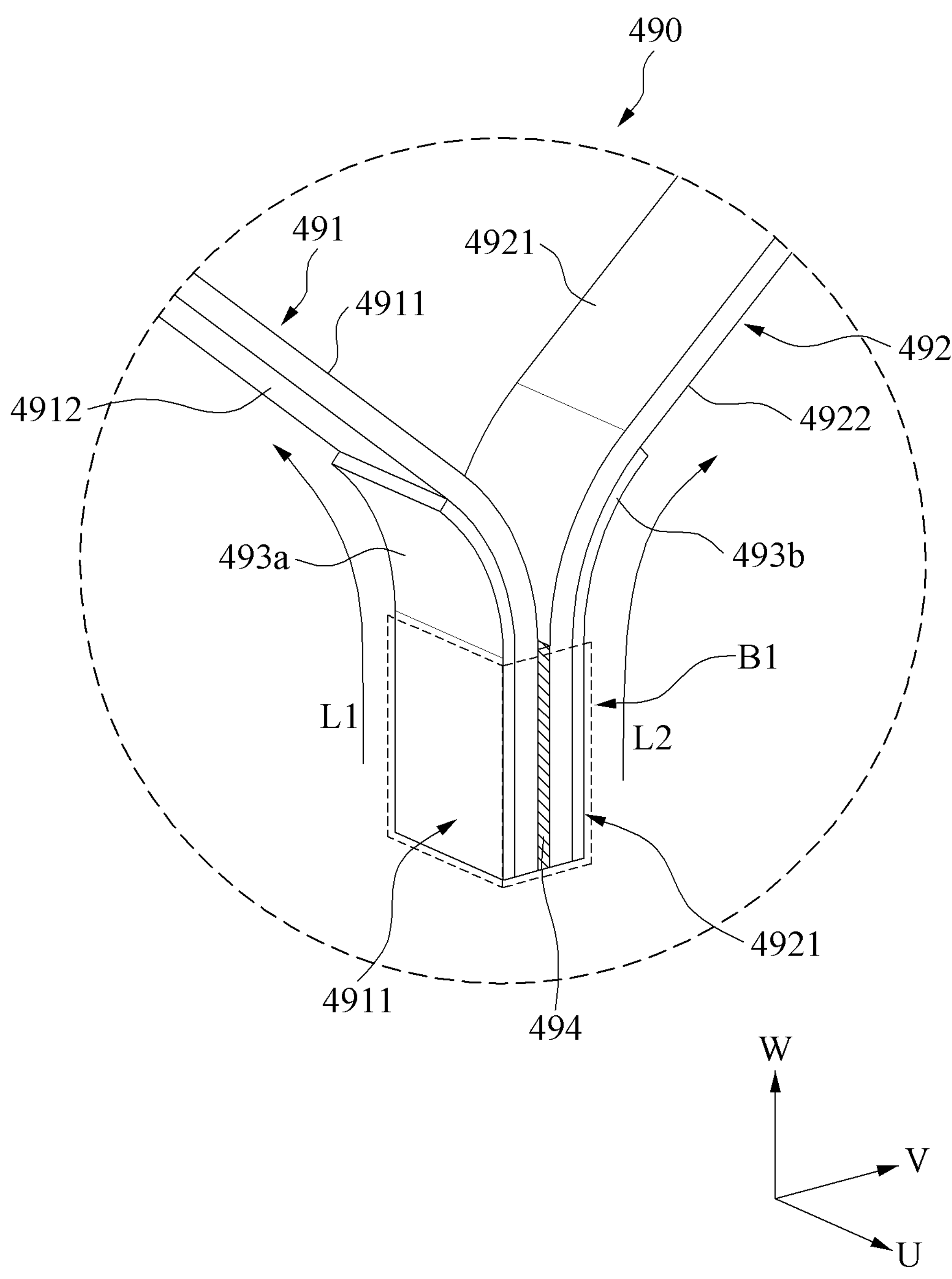
FIG. 4B is an enlarged view of an A area of FIG. 4A according to one or more embodiments.
Figure 4C:
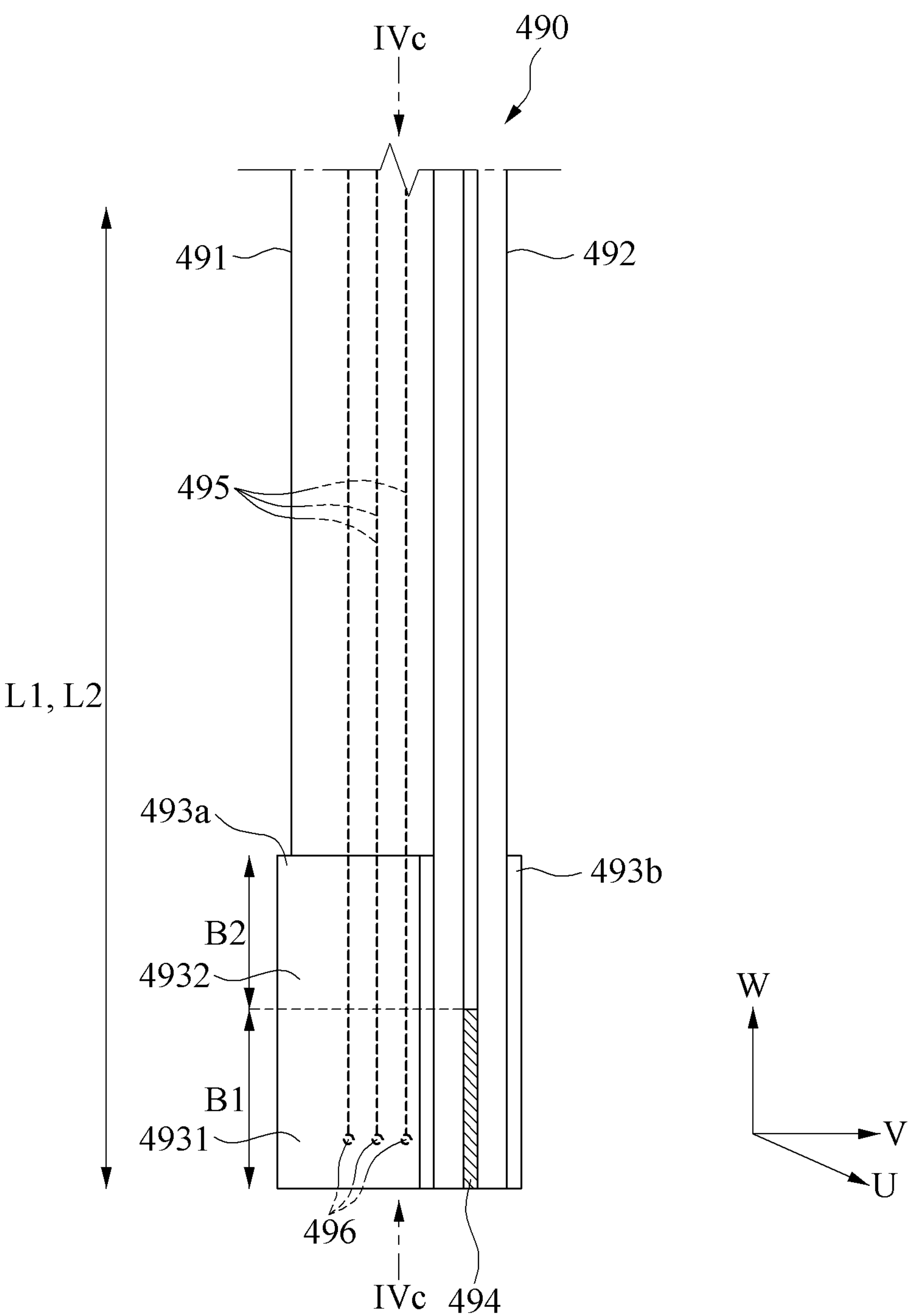
FIG. 4C is a partial perspective view of a bonding area of the flexible printed circuit board according to one or more embodiments.
Figure 4D:
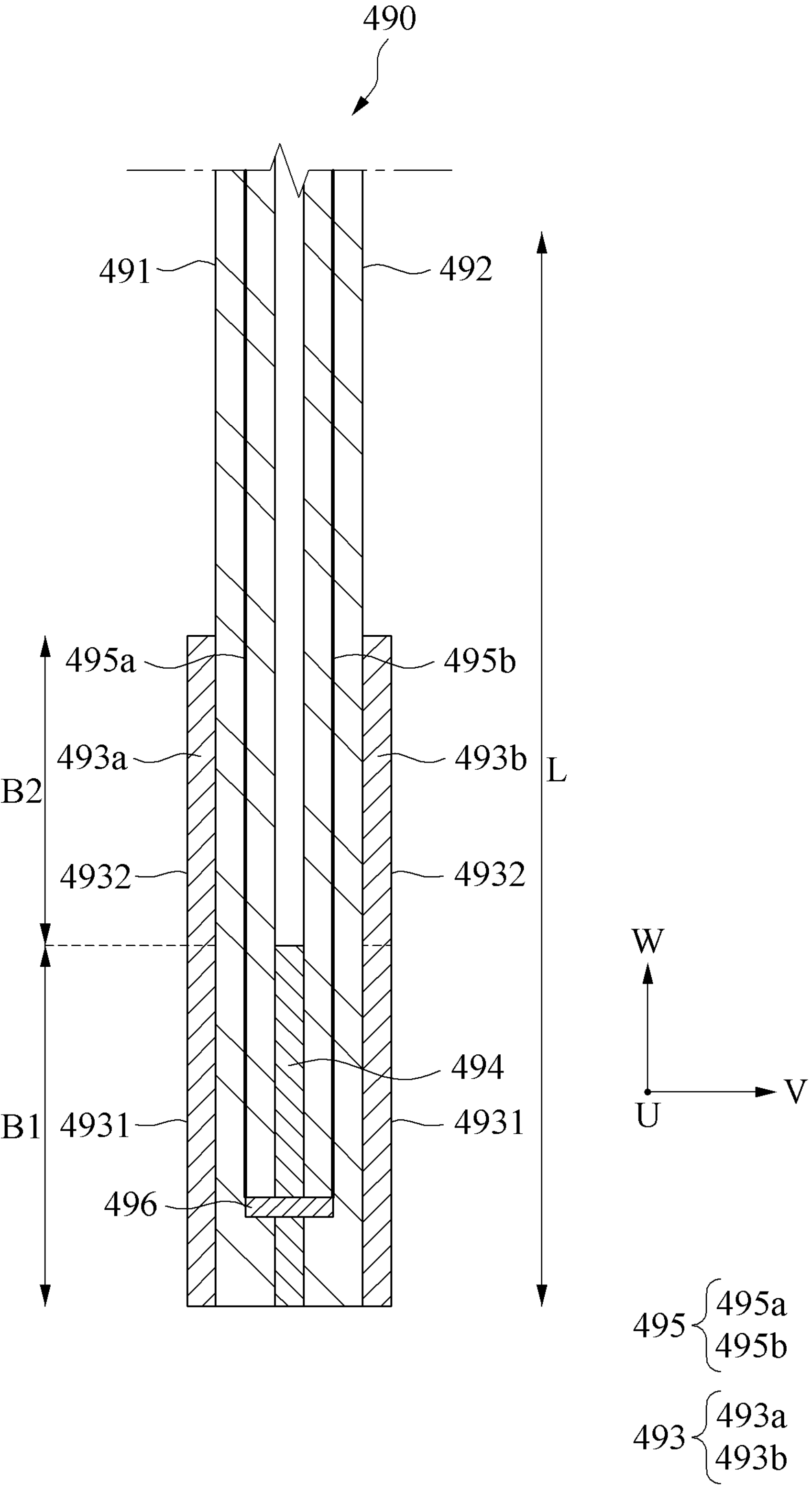
FIG. 4D is a partial cross-sectional view of the flexible printed circuit board according to a IVc-IVc line of FIG. 4C according to one or more embodiments.

FIG. 4A is a perspective view of the flexible printed circuit board according one or more embodiments, FIG. 4B is an enlarged view of an A area of FIG. 4A, FIG. 4C is a partial perspective view of a bonding area of the flexible printed circuit board according to one or more embodiments, and FIG. 4D is a partial cross-sectional view of the flexible printed circuit board according to a IVc-IVc line of FIG. 4C.

Referring to FIGS. 4A to 4D, a flexible printed circuit board 490 according to one or more embodiments may include a segmental structure to reduce stress according to a bending operation. According to one or more embodiments, the flexible printed circuit board 490 may include a first wire 491, a second wire 492, a bonding sheet 494, a signal via 496, and a rigid member 498.

According to one or more embodiments, the first wire 491 may include a first board surface 4911 and a second board surface 4912 opposite to the first board surface and may extend along a first length direction L1. The second wire 492 may include a third board surface 4921 and a fourth board surface 4922 opposite to the third board surface 4921 and may extend along a second length direction L2. According to one or more embodiments, the first wire 491 may include a first bonding portion 4914 formed at an end of the first length direction L1 and may include a second bonding portion 4924 formed at an end of the second length direction L2. The first wire 491 and the second wire 492 may be connected through the first bonding portion 4914 and the second bonding portion 4924 and may form a bonding area B1. According to one or more embodiments, the first wire 491 and the second wire 492 may be connected such that the first board surface 4911 and the third board surface 4921 may face each other in the bonding area B1. According to one or more embodiments, the first wire 491 and the second wire 492, which form the bonding area B1, may have the substantially same form, such as, an overlapping form in a facing state.

According to one or more embodiments, the first wire 491 and the second wire 492 may each include a signal circuit 495 for signal transmission. According to one or more embodiments, the first wire 491 may include a first signal circuit 495*a* formed along the first length direction L1 and the second wire 492 may include a second signal circuit 495*b* formed along the second length direction L2. According to one or more embodiments, the signal circuit 495 may be formed with metal (e.g., copper) patterning on a surface of a layer forming the wires 491 and 492. According to one or more embodiments, the wires 491 and 492 may include a base layer of a polyimide (PL) material, and the signal circuit 495 may be formed with the surface etched to form a pattern after a metal layer is formed in various known methods, such as sputtering, plating, or laminating on the base layer. In this case, a dielectric layer may be applied to the surface of the metal pattern forming the signal circuit 495. According to one or more embodiments, the first signal circuit 495*a* and the second signal circuit 495*b* may be electrically connected to each other through the bonding area B1. According to one or more embodiments, the first wire 491 may include a plurality of first signal circuits 495*a* and the second wire 492 may include a plurality of second signal circuits 495*b* of which the number corresponds to the number of the plurality of first signal circuits 495*a*.

According to one or more embodiments, the first wire 491 and the second wire 492 may electrically connect components inside an electronic device (e.g., the electronic device 101 of FIG. 1, the electronic device 201 of FIG. 2C, or the electronic device 301 of FIG. 3A) through the first signal circuit 495*a* and the second signal circuit 495*b*. According to one or more embodiments, the first wire 491 may include a first connector 4915 connected to a part opposite to the first bonding portion 4914 based on the first length direction L1 and configured to be connected to another component (e.g., the first or second component of FIG. 3A). The first wire 491 may include a second connector 4925 connected to a part opposite to the second bonding portion 4924 based on the second length direction L2 and configured to be connected to the other component (e.g., the first or second component of FIG. 3A). In addition, although the flexible printed circuit board 490 including two wires connected through one bonding area B1 is illustrated in the drawing, one or more embodiments are provided for ease of description, and the structure of the flexible printed circuit board 490 is not limited thereto. According to one or more embodiments, the flexible printed circuit board 490 may include three or more separate wires, and the separate wires may be sequentially connected through the bonding area B1 formed at an end. Hereinafter, for ease of description, one or more embodiments of the flexible printed circuit board 490 including the first wire 491 and the second wire 492 is mainly described.

According to one or more embodiments, the first wire 491 and the second wire 492 may be formed of a flexible material and may change shapes depending on an operation (e.g., the state change operation of the electronic device between the first state of FIG. 3A and the second state of FIG. 3B) of the electronic device. According to one or more embodiments, the first wire 491 and the second wire 492 may bend such that a gap between the first board surface 4911 and the third board surface 4921 changes, based on the bonding area B1, depending on the operation of the electronic device. According to one or more embodiments, the first wire 491 may include one or more first bending portions 4913 of which at least a portion partially bends and the second wire 492 may include one or more second bending portions 4923 of which at least a portion partially bends. In this case, the first bending portions 4913 may be formed between the first connector 4915 and the bonding area B1 and the second bending portions 4923 may be formed between the second connector 4925 and the bonding area B1.

According to one or more embodiments, the bonding sheet 494 may bond a first bonding portion of the first wire 491 and a second bonding portion of the second wire 492. According to one or more embodiments, the bonding sheet 494 may be in the bonding area B1 and may bond the first wire 491 and the second wire 492 with both sides bonded to a first base surface and a second base surface. According to one or more embodiments, the bonding sheet 494 may be between the first base surface and a third base surface to which an adhesive is applied or may be formed with an adhesive applied between the first base surface and the third base surface forming the bonding area B1 being hardened. According to one or more embodiments, in a state in which the second board surface 4912 is viewed, as illustrated in FIG. 4B, the bonding sheet 494 may be formed to have the substantially same shape as the shape of the first wire 491 and the second wire 492 that form the bonding area B1.

According to one or more embodiments, the bonding sheet 494 may be formed of a material having relatively high stiffness compared to the first wire 491 and the second wire 492. According to one or more embodiments, the bonding sheet 494 may be formed of polypropylene resin, epoxy resin, ceramic, glass, and/or metal. In this case, the bonding sheet 494 may improve the rigidity of a bonding portion of the flexible printed circuit board 490 such that a change in the shape of the bonding area B1 may be limited in the process of changing the shape of the flexible printed circuit board 490 in response to the operation of the electronic device.

According to one or more embodiments, a signal via 496 may electrically connect the first signal circuit 495*a* of the first wire 491 to the second signal circuit 495*b* of the second wire 492. According to one or more embodiments, the signal via 496 may be in the bonding area B1 and may penetrate the first wire 491 and the second wire 492 and connect the first signal circuit 495*a* to the second signal circuit 495*b*. According to one or more embodiments, the first signal circuit 495*a* and the second signal circuit 495*b* may include a via hole in the bonding area B1, and the signal via 496, by being inserted into a via hole of each of the first signal circuit 495*a* and the second signal circuit 495*b*, may electrically connect the first signal circuit 495*a* to the second signal circuit 495*b*. According to one or more embodiments, there may be one or more signal vias 496 correspondingly to the number of signal circuits formed in a wire. According to one or more embodiments, as illustrated in FIG. 4C, when the first wire 491 and the second wire 492 may respectively include three signal circuits, three signal vias 496 for connecting three signal circuits formed respectively in the first wire 491 and the second wire 492 to one another may be in the bonding area B1. However, the number of signal circuits and the number of signal vias 496 illustrated in the drawing are provided as one or more embodiments for ease of description, the number of signal circuits and the number of signal vias 496 are not limited thereto.

According to one or more embodiments, a first cover 493*a* and a second cover 493*b* may be on the surface of the first wire 491 and the second wire 492 to reinforce the bonding area B1. According to one or more embodiments, the first cover 493*a* may be placed to cover the second board surface 4912 of the first wire 491 forming the bonding area B1 and the second cover 493*b* may be placed to cover the fourth board surface 4922 of the second wire 492 forming the bonding area B1. As illustrated in FIG. 4B, based on a state in which the bonding area B1 is viewed from the second board surface 4912, the first cover 493*a* may be placed on at least a portion of the second board surface 4912 to overlap with the bonding sheet 494 and the second cover 493*b* may be placed on at least a portion of the fourth board surface 4922 to overlap with the bonding sheet 494. Hereinafter, for ease of description, the first cover 493*a* and the second cover 493*b* may be collectively referred to as the covers 493*a* and 493*b*, and the description of the cover 493 may commonly apply to the first cover 493*a* and the second cover 493*b* unless otherwise stated.

According to one or more embodiments, the cover 493 may be formed of a flexible material. According to one or more embodiments, the cover 493 may include a first cover portion 4931 and a second cover portion 4932. According to one or more embodiments, based on a state in which the second board surface 4912 is viewed, the first cover portion 4931 may overlap with the bonding sheet 494 and may form the bonding area B1, and the second cover portion 4932 may extend from the first cover portion 4931 in the not to overlap with the bonding sheet 494. According to one or more embodiments, the second cover portion 4932 of the first cover 493*a* may extend from the first cover portion in the first length direction L1 and the second cover portion 4932 of the second cover 493*b* may extend from the first cover portion 4931 in the second length direction L2.

According to one or more embodiments, the second cover portion 4932 of the first cover 493*a* and the second cover 493*b* may form a reinforcing area B2 extending from the bonding area B1 in the length directions L1 and L2. According to one or more embodiments, the second cover portion 4932 of each of the covers 493*a* and 493*b* forming the reinforcing area B2 may guide the second board surface 4912 and the fourth board surface 4922 may form a curved surface by partially bending while supporting the second board surface 4912 and the fourth board surface 4922 in the process of a distance changing between the first board surface 4911 and the third board surface 4921 according to the shape change of the flexible printed circuit board 490. Accordingly, the second cover portion of the covers 493*a* and 493*b* may reduce the phenomenon that excessive stress is concentrated in the first wire 491 and the second wire 492 positioned at the boundary of the bonding area B1 and the reinforcing area B2.

According to one or more embodiments, the rigid member 498 may improve the rigidity of a certain portion of the first wire 491 and the second wire 492. According to one or more embodiments, the rigid member 498 may include a first rigid member 498*a* and a second rigid member 498*b*, in which the first rigid member 498*a* may be at least a portion of the surface of the first wire 491 and the second rigid member 498*b* may be at least a portion of the surface of the second wire 492. According to one or more embodiments, the rigid member 498 may be formed of a rigid material. According to one or more embodiments, the rigid member 498 may be formed of polymer, ceramic, glass, and/or metal. The rigid member 498, by supporting a part of a wire placed therein not to bend, may form a flat surface part of the wire that does not bend in the shape change process of the flexible printed circuit board 490. In this case, a position and range of a bending part of the wire may be adjusted through a position of the rigid member 498 relative to the wire. On the other hand, although FIG. 4A illustrates that the first rigid member 498*a* is on the first board surface 4911 of the first wire 491 and the second rigid member 498*b* is on the third board surface 4921 of the second wire 492, one or more embodiments are provided for ease of description, and the position of the rigid member 498 relative to the wires 491 and 492 and the number of rigid members 498 are not limited thereto. According to one or more embodiments, based on the first wire 491, the rigid member 498 may be on each of the first board surface 4911 and the second board surface 4912 of the first wire 491 or may be between the first connector 4915 and the bending portion 4913.

Figure 5A:
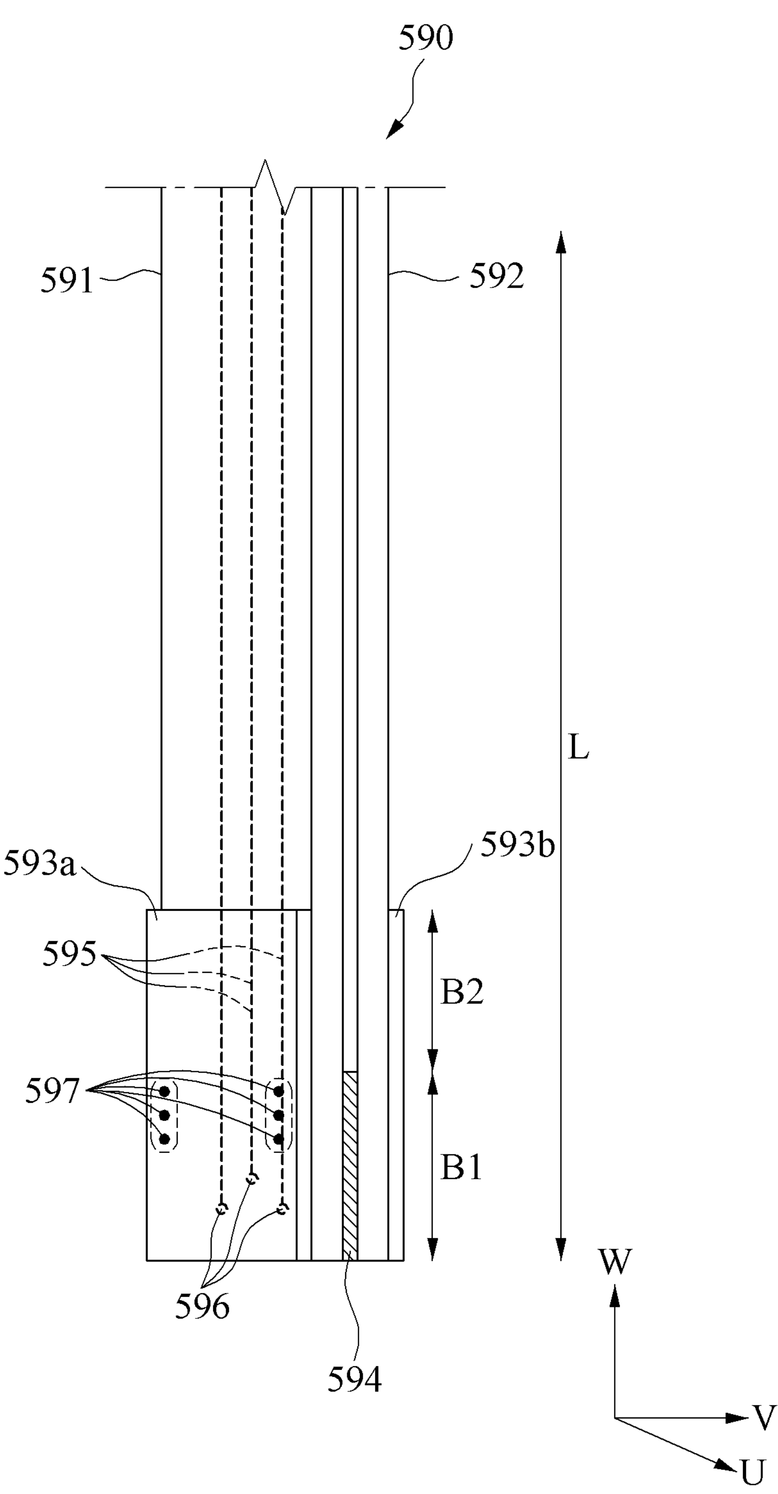
FIG. 5A is another partial perspective view of the bonding area of the flexible printed circuit board according to one or more embodiments.
Figure 5B:
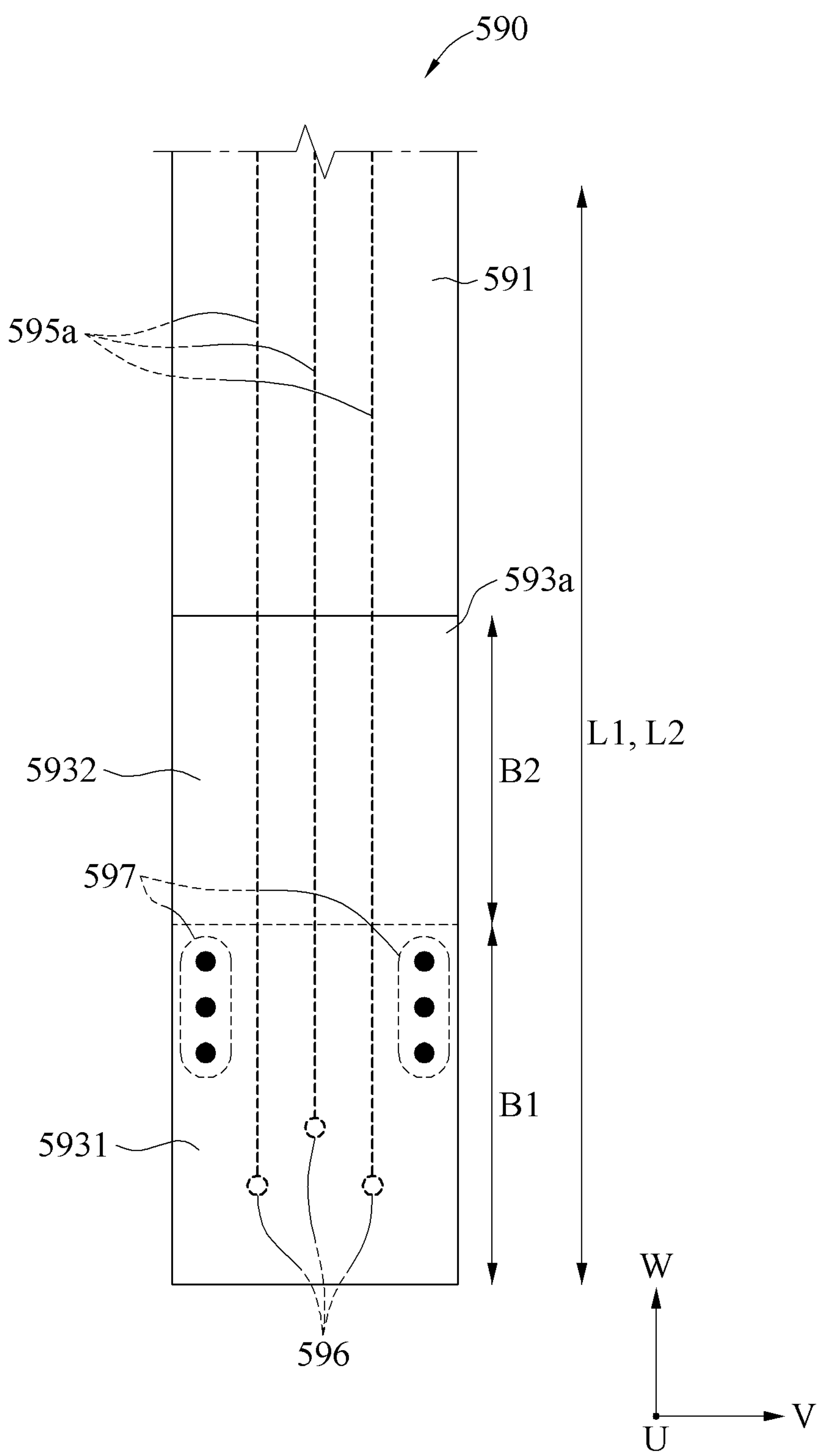
FIG. 5B is a partial plan view of the bonding area of the flexible printed circuit board according to one or more embodiments.
Figure 5C:
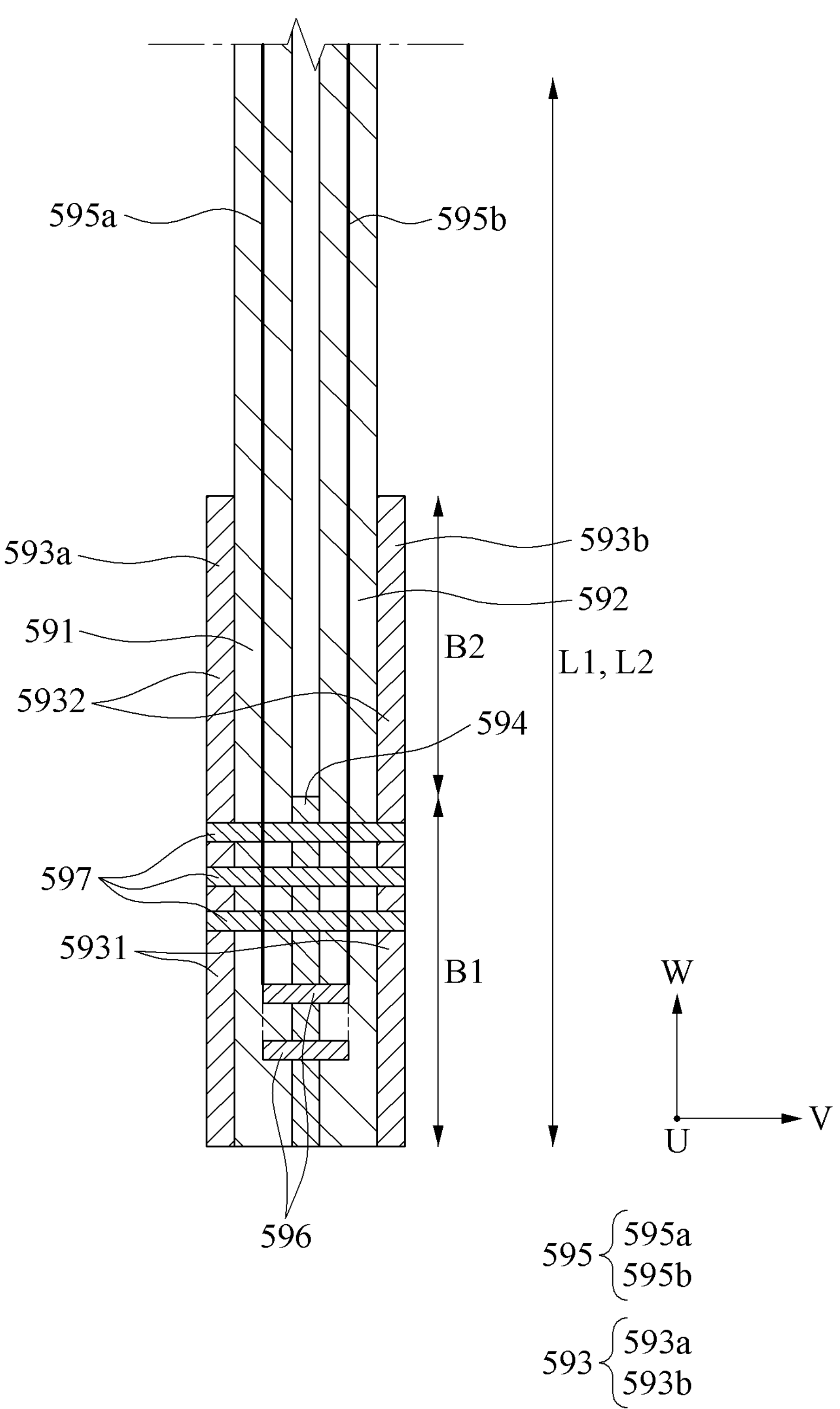
FIG. 5C is a partial cross-sectional view of the bonding area of the flexible printed circuit board according to one or more embodiments.

FIG. 5A is another partial perspective view of the bonding area of the flexible printed circuit board according to one or more embodiments, FIG. 5B is a partial plan view of the bonding area of the flexible printed circuit board according to one or more embodiments, and FIG. 5C is a partial cross-sectional view of the bonding area of the flexible printed circuit board according to one or more embodiments.

Referring to FIGS. 5A to 5C, a flexible printed circuit board 590 according to an embodiment may include a first wire 591, a second wire 592, a bonding sheet 594, a signal via 596, a first cover 593*a*, a second cover 593*b*, and a dummy via 597.

According to one or more embodiments, the first wire 591 and the second wire 592 may be connected to each other through a bonding area B1. In a bonding area, the first wire 591 and the second wire 592 may be on the surface to face each other. The first wire 591 may have a first length direction L1 and the second wire 592 may have a second length direction L2. According to one or more embodiments, the first wire 591 may include a first signal circuit 595*a* formed along the first length direction L1 and configured to transmit an electrical signal and the second wire 592 may include a second signal circuit 595*b* formed along the second length direction L2 and configured to transmit an electrical signal. According to one or more embodiments, the bonding sheet 594 may be in the bonding area B1, and both sides of the bonding sheet 594 may be bonded to the first wire 591 and the second wire 592, respectively. According to one or more embodiments, as the bonding sheet 594 is formed of a more rigid material compared to the first wire 591, the second wire 592 may limit a change of the shape of the bonding area B1 in the shape change process of the flexible printed circuit board 590. In this case, the first wire 591 and the second wire 592 may bend at least partially such that a gap between each other may be widened or narrowed, bordering the bonding area B1.

According to one or more embodiments, the signal via 596 may be in the bonding area and may connect the first wire 591 to the second wire 592 by penetrating the bonding sheet 594. The signal via 596 may electrically connect the first wire 591 to the second wire 592 while both ends of the signal via 596 are connected to the first signal circuit 595*a* and the second signal circuit 595*b* as illustrated in FIG. 5C.

According to one or more embodiments, a first cover 593*a* and a second cover 593*b* may be on the surface of the first wire 591 and the second wire 592 to reinforce the bonding area. According to one or more embodiments, the first cover 593*a* may be on the surface of the first wire 591 to face an opposite direction to the bonding sheet 594 and the second cover 593*b* may be on the surface of the second wire 592 to face an opposite direction to the bonding sheet 594. According to one or more embodiments, the first cover 593*a* and the second cover 593*b* that are formed of a flexible material may be transformed, conforming the bending of the wires 591 and 592.

According to one or more embodiments, based on a state in which the surface of the first wire 591 is viewed, as illustrated in FIG. 5B, the covers 593*a* and 593*b* may overlap with the bonding sheet 594 and may include a first cover portion 5931 forming the bonding area B1 and a second cover portion 5932 extending along the length direction of the wires from the first cover portion 5931 and forming a reinforcing area B2. According to one or more embodiments, the second cover portion 5932 may guide the bending of a part of the wires 591 and 592 positioned in the reinforcing area B2 such that the surface of the wires may not be folded in the process of the bending of the wires 591 and 592.

According to one or more embodiments, the dummy via 597 may improve the bonding strength of the bonding area B1 of the flexible printed circuit board 590. According to one or more embodiments, the dummy via 597, by penetrating and connecting the first cover 593*a* and the second cover 593*b*, may assist a bonding state of the first wire 591 and the second wire 592 in the bonding area B1 to be maintained solidly. According to one or more embodiments, the dummy via 597 may include a plurality of first dummy vias 597 placed in the bonding area. The plurality of first dummy vias 597 may penetrate the first cover portion 5931 of the second cover 593*b* and the first cover 593*a* and may connect them in a direction perpendicular to the surfaces of the wires. In this case, the plurality of first dummy vias 597 may simultaneously penetrate and physically connect the bonding sheets 594, covers 593*a* and 593*b*, the second wire 592, and the first wire 591 forming the bonding area B1 and may improve bonding strength.

According to one or more embodiments, the dummy via 597 may be placed not to overlap with the first signal circuit 595*a* and the second signal circuit 595*b* so as not to interfere with the transmission of an electrical signal through the flexible printed circuit board 590. The dummy via 597 may be adjacent to the first signal circuit 595*a* and the second signal circuit 595*b* in in a width direction perpendicular to first length direction L1. According to one or more embodiments, as illustrated in FIG. 5B, in a state in which the surface (e.g., the second board surface of FIG. 4A) of the first wire 591 is viewed, the signal via 596 may be placed at a center part in a width direction (e.g., a width in a V-axis direction) of the wires 591 and 592 perpendicular to the first length direction L1. According to one or more embodiments, the plurality of first dummy vias 597 may be placed on the first cover portion 5931 along both sides of the width direction of the wires.

According to one or more embodiments, the flexible printed circuit board 590 may stably maintain the bonding state of the bonding area B1 through a physical connection of the first cover 593*a* and the second cover 593*b* through the dummy via 597 together with the bonding of the first wire 591 and the second wire 592 through the bonding sheet 594.

Figure 6A:
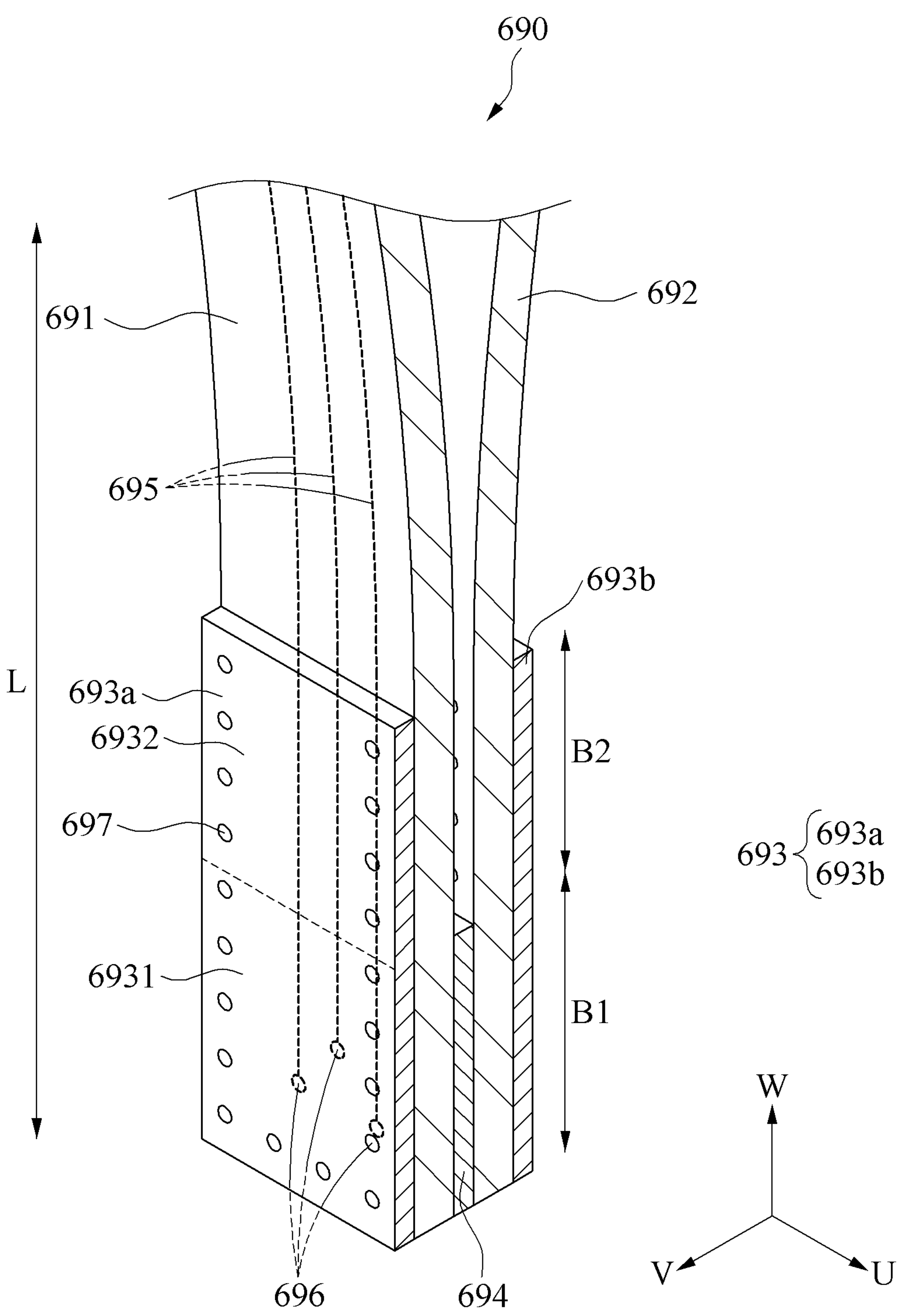
FIG. 6A is another partial perspective view of the bonding area of the flexible printed circuit board according to one or more embodiments.
Figure 6B:
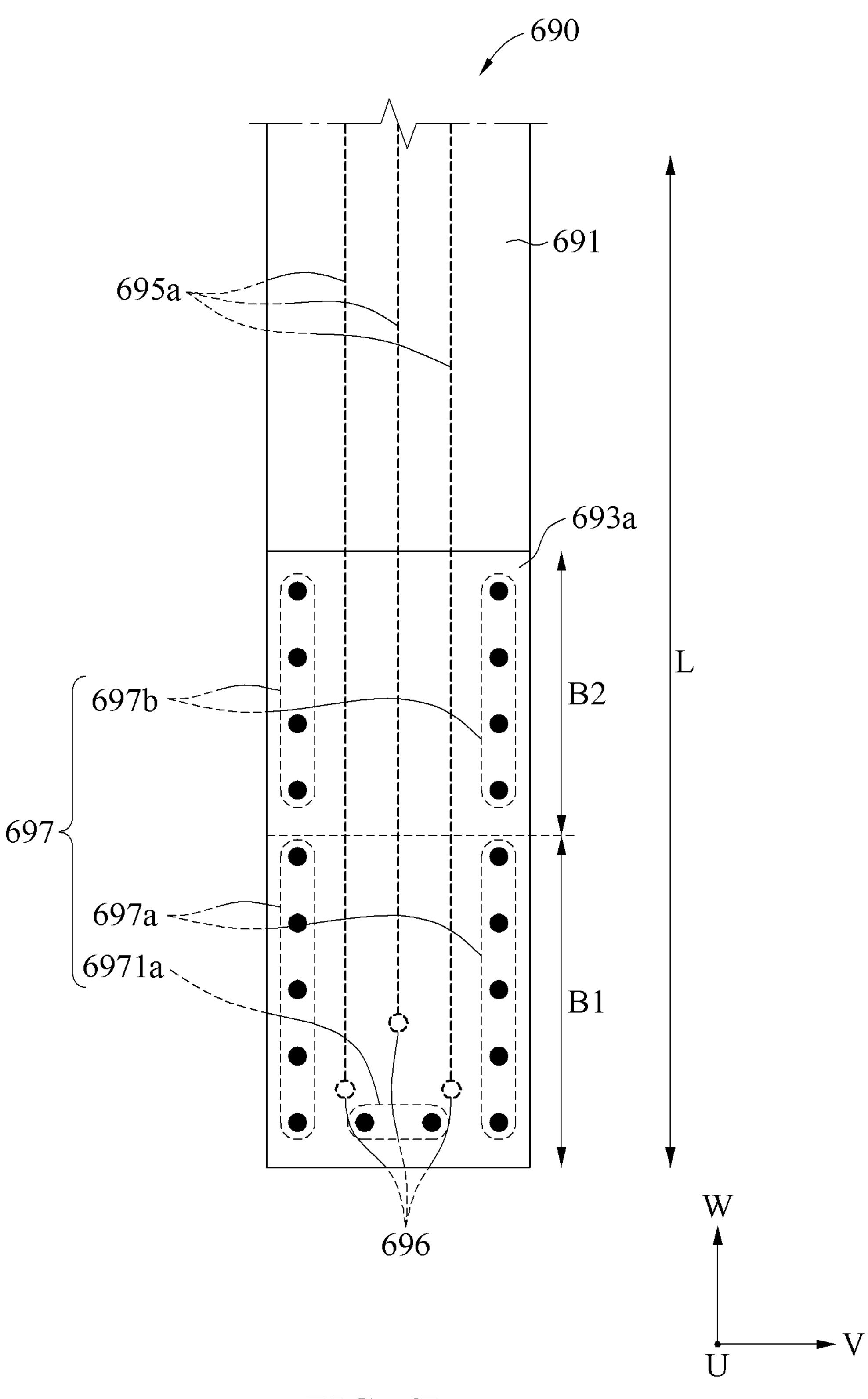
FIG. 6B is another partial plan view of the bonding area of the flexible printed circuit board according to one or more embodiments.
Figure 6C:
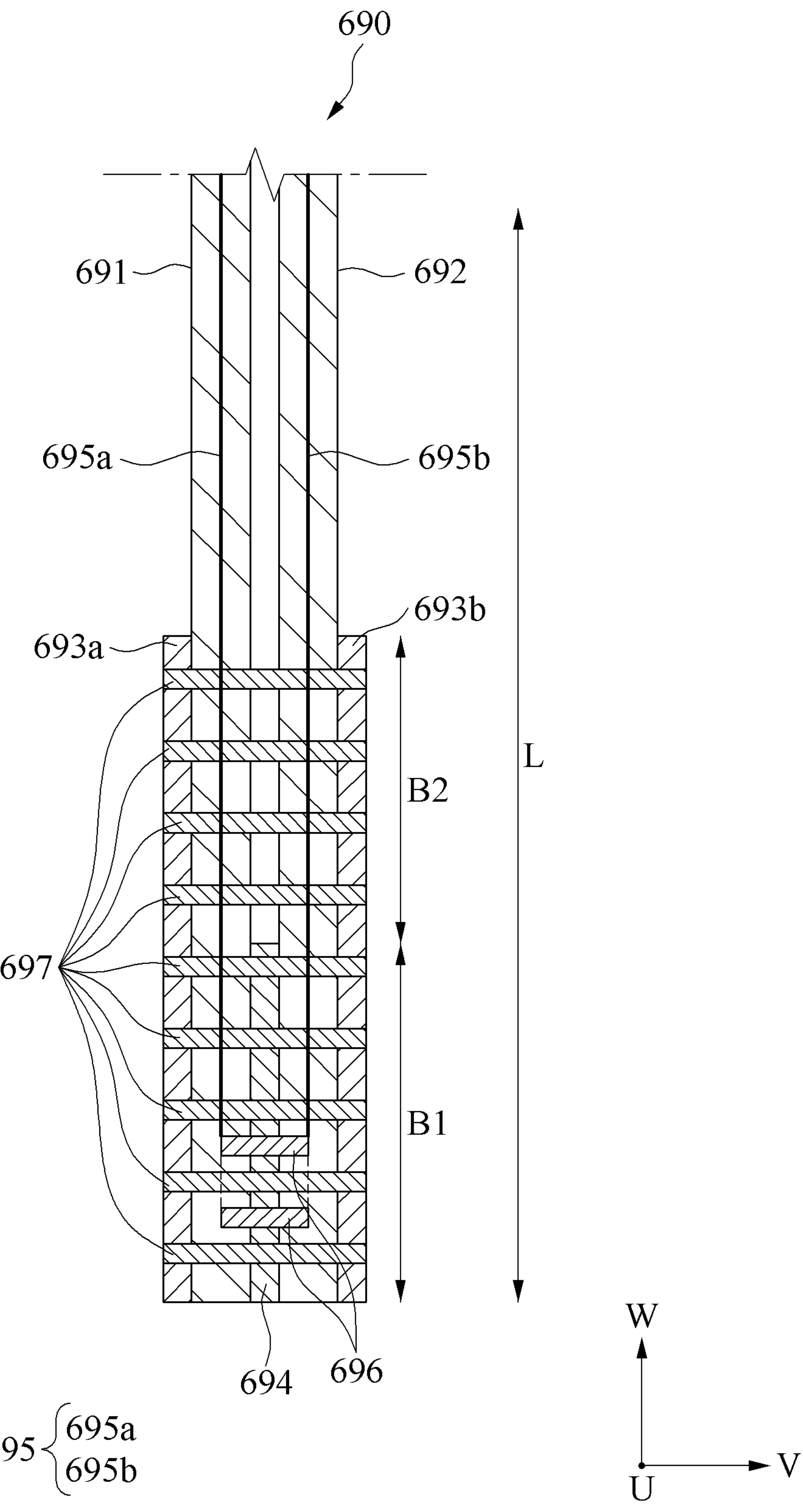
FIG. 6C is another partial cross-sectional view of the bonding area of the flexible printed circuit board according to one or more embodiments.

FIG. 6A is another partial perspective view of the bonding area of the flexible printed circuit board according to one or more embodiments, FIG. 6B is another partial plan view of the bonding area of the flexible printed circuit board according to one or more embodiments, and FIG. 6C is another partial cross-sectional view of the bonding area of the flexible printed circuit board according to one or more embodiments.

Referring to FIGS. 6A to 6C, a flexible printed circuit board 690 according to one or more embodiments may include a first wire 691, a second wire 692, a bonding sheet 694, a signal via 696, a first cover 693*a*, a second cover 693*b*, and a plurality of dummy vias 697.

According to one or more embodiments, the first wire 691 and the second wire 692 may be connected to each other through a bonding area B1. According to one or more embodiments, the first wire 691 may include a first signal circuit 695*a* formed along a first length direction L1 and the second wire 692 may include a second signal circuit 695*b* formed along a second length direction L2. According to one or more embodiments, the bonding sheet 694 may be in the bonding area B1, and both sides of the bonding sheet 694 may be bonded to the first wire 691 and the second wire 692, respectively. According to one or more embodiments, the bonding sheet 694, by improving the rigidity of the bonding area B1, may decrease the bending of the bonding area B1 in a shape change process of the flexible printed circuit board 690. In this case, the first wire 691 and the second wire 692 may bend at least partially such that a gap between each other may be widened or narrowed, bordering the bonding area B1.

According to one or more embodiments, the signal via 696 may be in the bonding area B1 and may connect the first wire 691 to the second wire 692 by penetrating the bonding sheet 694. The signal via 696 may electrically connect the first wire 691 to the second wire 692 while both ends of the signal via 696 are connected to the first signal circuit 695*a* and the second signal circuit 695*b* as illustrated in FIG. 5C.

According to one or more embodiments, the first cover 693*a* and the second cover 693*b* may be on the surface of the first wire 691 and the second wire 692 to reinforce the bonding area B1. According to one or more embodiments, the first cover 693*a* may be on the surface of the first wire 691 to face an opposite direction to the bonding sheet 694 and the second cover 693*b* may be on the surface of the second wire 692 to face an opposite direction to the bonding sheet 694. According to one or more embodiments, the first cover 693*a* and the second cover 693*b* that are formed of a flexible material may be transformed, conforming the bending of the wires 691 and 692. According to one or more embodiments, as illustrated in FIG. 6A, in a state in which a surface (e.g., the second board surface of FIG. 4A) of the first wire 691 is viewed, the cover 693 may include a first cover portion 6931 overlapping with the bonding sheet 694 and a second cover portion 6932 extending along the length directions L1 and L2 of the wires 691 and 692 from the first cover portion 6931. According to one or more embodiments, the first cover portion 6931 of the cover 693 may form the bonding area B1 and the second cover 6932 of the cover 693 may form a reinforcing area B2.

The second cover portion 6932, by supporting the outer surfaces of the wires 691 and 692 in the reinforcing area B2, may prevent excessive stress from being concentrated in a surface part of the wires 691 and 692 at a boundary of the bonding area B1 and the reinforcing area B2 and may decrease the occurrence of folding.

According to one or more embodiments, the plurality of dummy vias 697 may penetrate and connect the first cover 693*a* and the second cover 693*b* and may improve the bonding strength of the bonding area B1. According to one or more embodiments, the plurality of dummy vias 697 may be placed so as not to interfere with the transmission of an electrical signal through the flexible printed circuit board 690. According to one or more embodiments, as illustrated in FIG. 6B, in a state in which the surface (e.g., the second board surface of FIG. 4A) of the first wire 691 is viewed, the plurality of dummy vias 697 may be arranged to enclose the circumference of the signal via 696. According to one or more embodiments, the plurality of dummy vias 697 may be at both ends of a width direction (e.g., a width in a U-axis direction) of the wires along the first length direction. In this case, the plurality of dummy vias 697 may be arranged along the width direction at an end of the bonding area B1 where a signal circuit does not extend.

According to one or more embodiments, the dummy via 697 may include a first dummy via 697*a* placed on the first cover portion 6931 and a second dummy via 697*b* placed on the second cover portion 6932. According to one or more embodiments, the first dummy via 697*a*, by physically penetrating and connecting the first cover 693*a*, the first wire 691, the bonding sheet 694, the second wire 692, and the second cover 693*b*, may improve the bonding strength of the bonding area B1. According to one or more embodiments, the second dummy via 697*b*, by penetrating and connecting the second cover portion 6932 of the first cover 693*a* and the second cover portion 6932 of the second cover 693*b*, may constantly maintain a gap between the first wire 691 and the second wire 692, which form the reinforcing area B2. Accordingly, in the shape change process of the flexible printed circuit board 690, the second dummy via 697 may limit the bending of a part, which overlaps with the second cover portion 6932, of the first wire 691 and the second wire 692 and may reduce the concentration of stress in a part of the wires 691 and 692 forming the boundary of the bonding area B1 and the reinforcing area B2.

Figure 7:
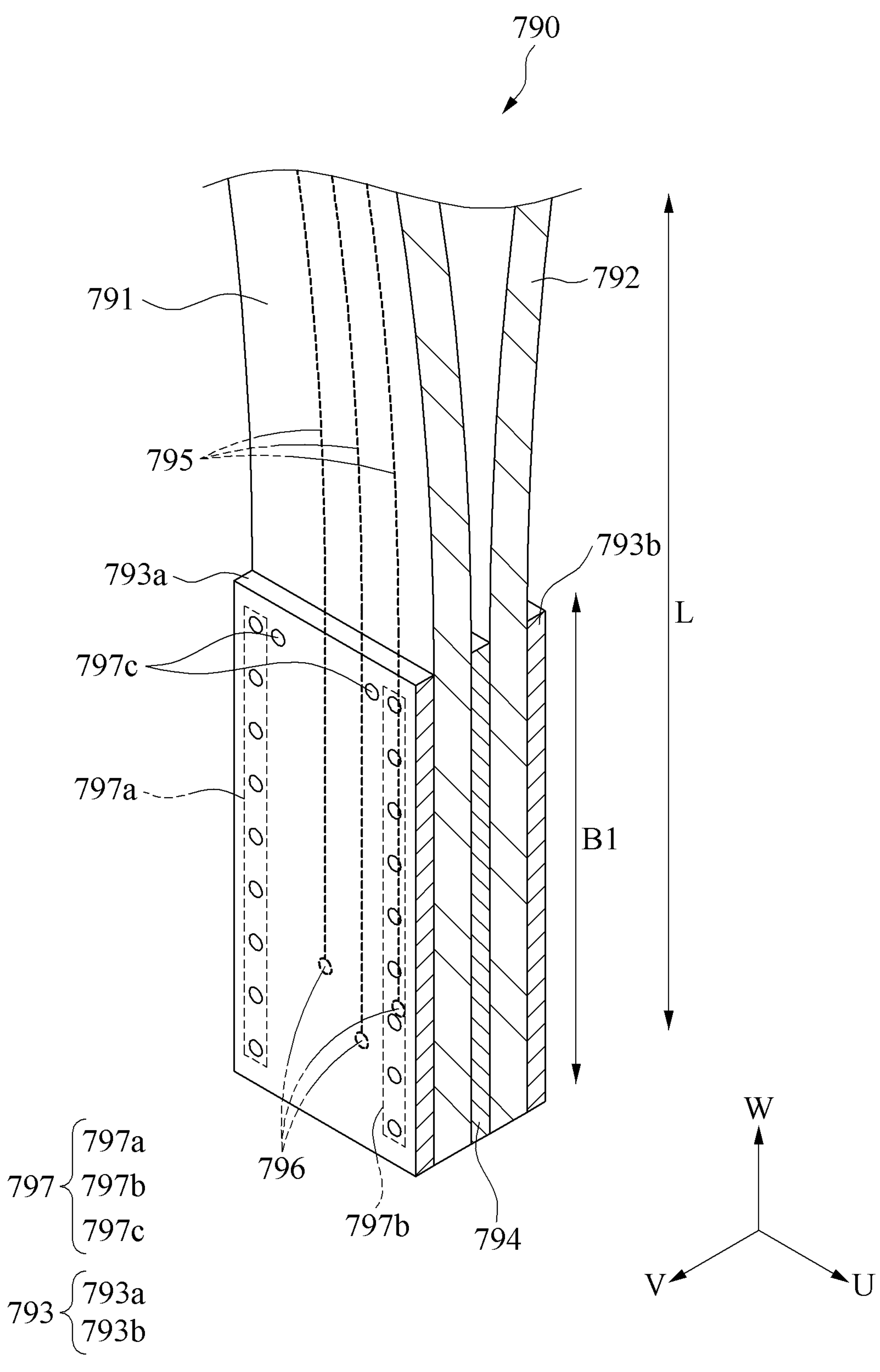
FIG. 7 is another partial perspective view of the bonding area of the flexible printed circuit board according to one or more embodiments.

FIG. 7 is another partial perspective view of the bonding area of the flexible printed circuit board according to one or more embodiments.

Referring to FIG. 7, a flexible printed circuit board 790 according to one or more embodiments may include a first wire 791, a second wire 792, a bonding sheet 794, a signal via 796, a first cover 793*a*, a second cover 793*b*, and a plurality of dummy vias 797.

According to one or more embodiments, the first wire 791 and the second wire 792 may be connected to each other through a bonding area B1. According to one or more embodiments, the first wire 791 and the second wire 792 may each include a signal circuit 795 formed along length directions L1 and L2. According to one or more embodiments, the bonding sheet 794 may be in the bonding area B1, and both sides of the bonding sheet 794 may be bonded to the first wire 791 and the second wire 792, respectively. According to one or more embodiments, the bonding sheet 794, by improving the rigidity of the bonding area B1, may decrease the bending of the bonding area B1 in a shape change process of the flexible printed circuit board 790. In this case, the first wire 791 and the second wire 792 may bend at least partially such that a gap between each other may be widened or narrowed, bordering the bonding area B1.

According to one or more embodiments, the signal via 796 may be in the bonding area B1 and may connect the first wire 791 to the second wire 792 by penetrating the bonding sheet 794. The signal via 796 may electrically connect the first wire 791 to the second wire 792 while both ends of the signal via 796 are connected to the first signal circuit 795*a* and the second signal circuit 795*b* as illustrated in FIG. 5C.

According to one or more embodiments, the first cover 793*a* and the second cover 793*b* may be on the surface of the first wire 791 and the second wire 792 to reinforce the bonding area B1. According to one or more embodiments, the first cover 793*a* may be on the surface of the first wire 791 to face an opposite direction to the bonding sheet 794 and the second cover 793*b* may be on the surface of the second wire 792 to face an opposite direction to the bonding sheet 794. According to one or more embodiments, the first cover 793*a* and the second cover 793*b* that are formed of a flexible material may be transformed, conforming the bending of the wires 791 and 792.

According to one or more embodiments, as illustrated in FIG. 7, in a state in which a surface (e.g., the second board surface of FIG. 4A) of the first wire 791 is viewed, a cover 793 may have the substantially same shape as that of the bonding sheet 794 and may be placed to overlap with the bonding sheet 794.

According to one or more embodiments, the plurality of dummy vias 797 may penetrate and connect the first cover 793*a* and the second cover 793*b*. In this case, the plurality of dummy vias 797, by penetrating and connecting the first cover 793*a*, the first wire 791, the bonding sheet 794, the second wire 792, and the second cover 793*b* in a direction perpendicular to a second board surface, may improve the bonding strength of the bonding area B1. According to one or more embodiments, the plurality of dummy vias 797 may be placed not to overlap with a signal circuit so as not to interfere with the signal transmission of the flexible printed circuit board 790. According to one or more embodiments, in a state in which a surface (e.g., the second board surface of FIG. 4A) of the first cover 793*a* is viewed, the plurality of dummy vias 797*a* and 797*b* may be arranged along a length direction at both ends of a width direction of the bonding area B1 to enclose the circumference of the signal via 796. According to one or more embodiments, the dummy vias 797 may include one or more auxiliary dummy vias 797*c* arranged along a width direction at a part of the cover 793 forming the boundary of the bonding area B1. The auxiliary dummy vias 797*c* may perform a function of reinforcing a bonding state of the boundary of the bonding area B1 such that the bonding state at the boundary of the bonding area B1 may not be released according to a gap change between the first wire 791 and the second wire 792.

Figure 8A:
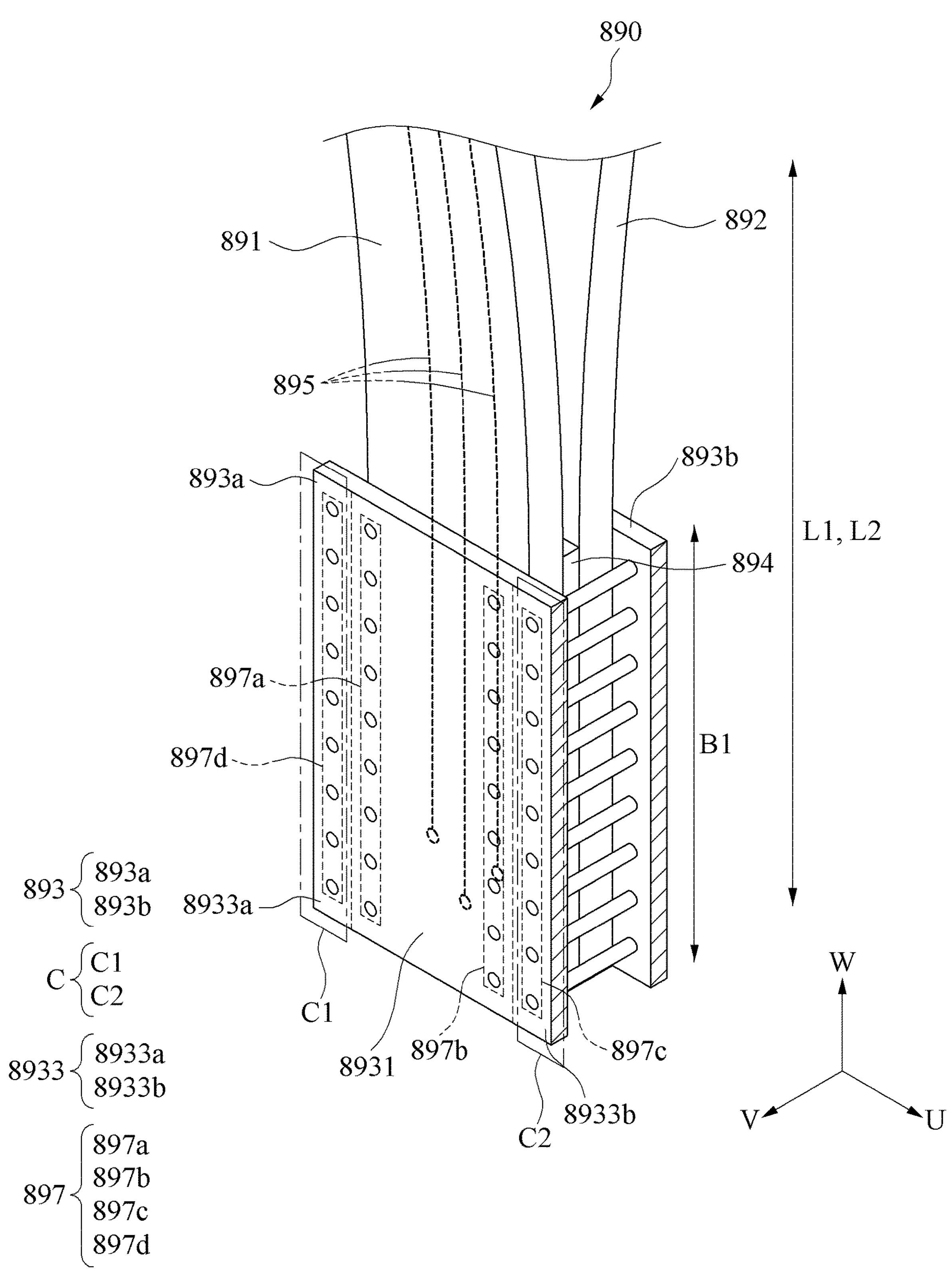
FIG. 8A is another partial perspective view of the bonding area of the flexible printed circuit board according to one or more embodiments.
Figure 8B:
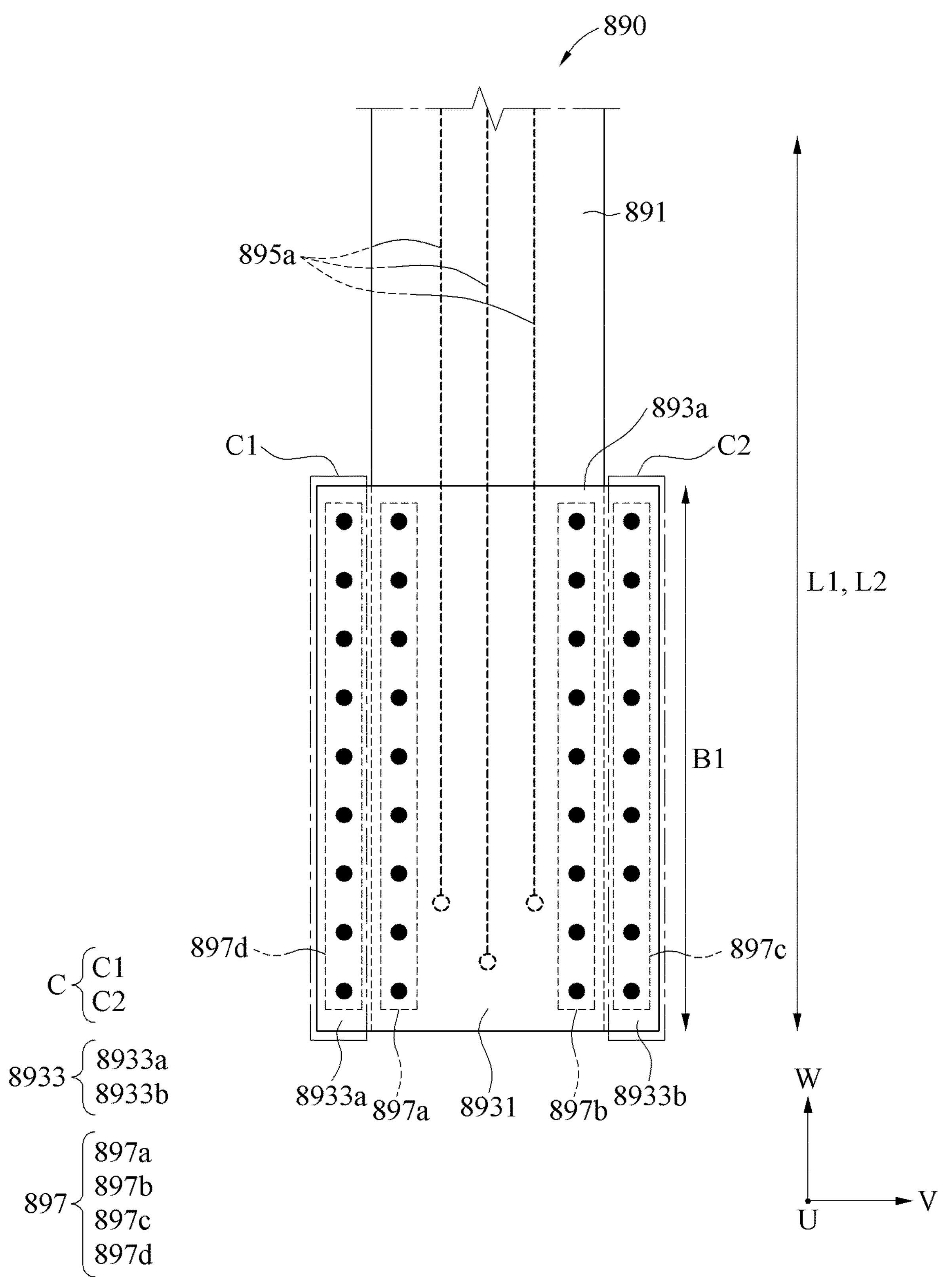
FIG. 8B is another partial plan view of the bonding area of the flexible printed circuit board according to one or more embodiments.

FIG. 8A is another partial perspective view of the bonding area of the flexible printed circuit board according to one or more embodiments and FIG. 8B is another partial plan view of the bonding area of the flexible printed circuit board according to one or more embodiments.

Referring to FIGS. 8A and 8B, a flexible printed circuit board 890 according to an embodiment may include a first wire 891, a second wire 892, a bonding sheet 894, a signal via 896, a first cover 893*a*, a second cover 893*b*, and a plurality of dummy vias 897.

According to one or more embodiments, the first wire 891 and the second wire 892 may be connected to each other through a bonding area B1. According to one or more embodiments, the first wire 891 may include a first signal circuit 895*a* formed along a first length direction L1 and the second wire 892 may include a second signal circuit 895*b* formed along a second length direction L2. According to one or more embodiments, the bonding sheet 894 may be in the bonding area B1, and both sides of the bonding sheet 894 may be bonded to the first wire 891 and the second wire 892, respectively. According to one or more embodiments, the bonding sheet 894, by improving the rigidity of the bonding area B1, may decrease the bending of the bonding area B1 in a shape change process of the flexible printed circuit board 890. In this case, the first wire 891 and the second wire 892 may bend at least partially such that a gap between each other may be widened or narrowed, bordering the bonding area B1.

According to one or more embodiments, the signal via 896 may be in the bonding area B1 and may connect the first wire 891 to the second wire 892 by penetrating the bonding sheet 894. The signal via 896 may electrically connect the first wire 891 to the second wire 892 while both ends of the signal via 896 are connected to the first signal circuit 895*a* and the second signal circuit 895*b* as illustrated in FIG. 5C.

According to one or more embodiments, the first cover 893*a* and the second cover 893*b* may be on the surface of the first wire 891 and the second wire 892 to reinforce the bonding area B1. According to one or more embodiments, the first cover 893*a* may be on the surface of the first wire 891 to face an opposite direction to the bonding sheet 894 and the second cover 893*b* may be on the surface of the second wire 892 to face an opposite direction to the bonding sheet 894. According to one or more embodiments, the first cover 893*a* and the second cover 893*b* that are formed of a flexible material may be transformed, conforming the bending of the wires 891 and 892.

According to one or more embodiments, based on a state in which the surface (e.g., the second board surface of FIG. 4A) of the wires 891 and 892 is viewed, the cover 893 may include a first cover portion 8931 overlapping with the bonding sheet 894 and forming the bonding area B1 and a third cover portion 8933 forming a second reinforcing area C by extending to both sides of the first cover portion 8931 along a width direction (e.g., a width in a U-axis direction) perpendicular to the first length direction L1. The third cover portion 8933 may include a 3-1th cover portion 8933*a* extending to a left side (e.g., a −U-axis direction) of the first cover portion 8931 and forming a 2-1th reinforcing area C1 and a 3-2th cover portion 8933*b* extending to a right side (e.g., a +U-axis direction) of the first cover portion 8931 and forming a 2-2th reinforcing area C2. On the other hand, although a pair of third cover portions 8933*a* and 8933*b* connected to the first cover portion is illustrated in the drawing, is the one or more embodiments are provided for ease of description. The cover 893 may include one third cover portion 8933*a* or 8933*b* of the 3-1th cover portion 8933*a* and the 3-2th cover portion 8933*b*, and an area of the pair of third cover portions 8933*a* and 8933*b* may be the same as or different from each other.

According to one or more embodiments, the plurality of dummy vias 897 may penetrate and connect the first cover 893*a* and the second cover 893*b*. According to one or more embodiments, the plurality of dummy via 897 may include a plurality of first dummy vias 897*a* and 897*b* placed on the first cover portion 8971 and a plurality of third dummy vias 897*c* and 897*d* placed on the third cover portion 8973.

According to one or more embodiments, the plurality of first dummy vias 897*a* and 897*b*, by penetrating and connecting the first cover 893*a*, the first wire 891, the bonding sheet 894, the second wire 892, and the second cover 893*b* in a direction perpendicular to a surface of the wires 891 and 892, may improve the bonding strength of the bonding area B1. According to one or more embodiments, the plurality of first dummy vias 897*a* and 897*b* may be arranged along a length direction at both ends of a width direction of the bonding area B1 not to overlap with a signal circuit 895. According to one or more embodiments, the plurality of first dummy vias 897*a* and 897*b* may include a 1-1th dummy via 897*a* on a left side (e.g., the −U-axis direction) of the width direction of the bonding area B1 and a 1-2th dummy via 897*b* on a right side (e.g., the +U-axis direction) of the width direction.

According to one or more embodiments, the plurality of third dummy vias 897*c* and 897*d* by being arranged on the third cover portion 8933 along the first length direction L1 and penetrating and connecting the first cover 893*a* and the second cover 893*b* that form the third cover portion 8933, may constantly maintain a gap between the first cover 893*a* and the second cover 893*b*. According to one or more embodiments, the plurality of third dummy vias 897*c* and 897*d* may include a 3-1th dummy via 897*c* placed on the 3-1th cover portion 8933*a* and a 3-2th dummy via 897*d* placed on the 3-2th cover portion 8933*b*.

The plurality of third dummy vias 897*c* and 897*d*, by maintaining a gap between the first cover 893*a* and the second cover 893*b* that form the second reinforcing areas C1 and C2, may reinforce the bonding strength of the bonding area B1.

According to one or more embodiments, the electronic device 301 includes the first housing 310, the second housing 320 partially movably connected to the first housing 310 in the moving direction D1, the display 261 supported by the first housing 310 and the second housing 320 and configured to change between a first state and a second state, in which an area of a display area visually exposed to the outside according to a relative movement of the first housing and the second housing is at the minimum in the first state and the area of the display area is at the maximum in the second state, and a flexible printed circuit board of which a length in the moving direction changes according to the relative movement of the first housing and the second housing, in which the flexible printed circuit board 490 includes the first wire 491 including the first signal circuit 495*a* formed along the first length direction L1, the second wire 492 including the second signal circuit 495*b* formed along the second length direction L2, the bonding sheet 494 configured to bond the first wire 491 and the second wire 492 along the bonding area B1, and one or more signal vias 496 penetrating the first wire 491 and the second wire 492 and configured to electrically connect the first signal circuit 495*a* to the second signal circuit 495*b*.

According to one or more embodiments, the first wire 491 may include the first board surface 4911 and the second board surface 4912 opposite to the first board surface 4911, and the second wire 492 may include the third board surface 4921 and the fourth board surface 4922 opposite to the third board surface 4921, in which, in the bonding area B1, the first board surface 4911 and the third board surface 4921 may face each other with the bonding sheet 494 therebetween, and the first wire 491 and the second wire 492 may be formed to have the substantially same shape as that of the bonding sheet 494.

According to one or more embodiments, the flexible printed circuit board 490, based on a state in which the second board surface 4912 is viewed, may further include the first cover 493*a* placed on at least a portion of the second board surface 4912 to overlap with the bonding sheet 494, and, based on a state in which the fourth board surface 4922 is viewed, may further include the second cover 493*b* placed on at least a portion of the fourth board surface 4922 to overlap with the bonding sheet 494.

According to one or more embodiments, the flexible printed circuit board 490 may further include one or more dummy vias 597 connected to penetrate the first cover 493*a* and the second cover 493*b*.

According to one or more embodiments, in a state in which the second board surface 4912 is viewed, the one or more dummy vias 597 may be arranged not to overlap with the first signal circuit 495*a* and the second signal circuit 495*b*.

According to one or more embodiments, in a state in which the second board surface 4912 is viewed, each of the first cover 593*a* and the second cover 593*b* may include the first cover portion 5951 and the second cover portion 5932, in which the first cover portion 5951 overlaps with the bonding sheet 594 and forms the bonding area B1 and the second cover portion 5932 extends from the first cover portion 5931 in the first length direction L1 and the second length direction L2 not to overlap with the bonding sheet 494.

According to one or more embodiments, the flexible printed circuit board 690 may further include the plurality of dummy vias 697 connected to penetrate the first cover 593*a* and the second cover 693*b*, and the dummy vias 697 may include the plurality of first dummy vias 697*a* placed on the first cover portion 6931 and the plurality of second dummy vias 697*b* placed on the second cover portion 6932.

According to one or more embodiments, in a state in which the second board surface 4912 is viewed, the plurality of first dummy vias 597*a* may be respectively arranged on both sides of the one or more signal vias 596 along a width direction perpendicular to the first length direction L1.

According to one or more embodiments, in a state in which the second board surface 4912 is viewed, each of the first cover 893*a* and the second cover 893*b* may include the first cover portion 8931 and the third cover portions 8933*a* and 8933*b*, in which the first cover portion 8931 overlaps with the bonding sheet 894 and forms the bonding area B1 and the third cover portions 8933*a* and 8933*b* extends respectively to both sides of the first cover portion 8931 along the width direction of the first length direction L1.

According to one or more embodiments, the flexible printed circuit board 890 may further include the plurality of dummy vias 897 connected to penetrate the first cover 893*a* and the second cover 893*b*, and the dummy vias 597, in a state in which the second board surface 4912 is viewed, may include the plurality of first dummy vias 897*a* placed on the first cover portion 8931 and the plurality of third dummy vias 897*c* placed on the third cover portions 8933*a* and 8933*b*.

According to one or more embodiments, in a state in which the second board surface 4912 is viewed, each of the first cover 793*a* and the second cover 793*b* may have the substantially same shape as that of the bonding sheet 794 and may be placed to overlap with the bonding sheet 794, and the flexible printed circuit board 790 may penetrate and connect the first cover 793*a* and the second cover 793*b* and, in a state in which the second board surface 4912 is viewed, may further include the plurality of dummy vias 797 arranged to enclose the circumference of the one or more signal vias 796.

According to one or more embodiments, the flexible printed circuit board 790 may further include the first connector 4915 connected to a first end of the first wire 491 opposite to the bonding area B1 based on the first length direction L1 and may further include the second connector 4925 connected to a second end of the second wire 492 opposite to the bonding area B1 based on the second length direction L2.

According to one or more embodiments, the first wire 491 may be formed between the first connector 4915 and the bonding area B1 and may include the first bending portion 4913 of which at least a portion partially bends, and the second wire 492 may be formed between the second connector 4925 and the bonding area B1 and may include the second bending portion 4923 of which at least a portion partially bends.

According to one or more embodiments, the flexible printed circuit board 790 may further include the first rigid member 498*a* placed on at least a portion of a surface of the first wire 491 and configured to reinforce the rigidity of the first wire 491 and the second rigid member 498*b* placed on at least a portion of a surface of the second wire 492 and configured to reinforce the rigidity of the second wire 492.

According to one or more embodiments, the bonding sheet 494 may be formed of a more rigid material than that of the first wire 491 and the second wire 492.

According to one or more embodiments, the flexible printed circuit board 490 includes the first wire 491 including the first board surface 4911 and the second board surface 4912 that is opposite to the first board surface 4911, in which the first signal circuit 495*a* is formed along a length direction, the second wire 492 including the third board surface 4921 and the fourth board surface 4922 that is opposite to the third board surface 4921 and connected to the first wire 491 through the bonding area B1, the bonding sheet 494 placed in the bonding area B1 and with each of both surfaces bonded to the first board surface 4911 and the third board surface 4921, the signal via 496 penetrating the first wire 491 and the second wire 492 and configured to electrically connect the first signal circuit 495*a* to the second signal circuit 495*b*, in a state in which the second board surface 4912 is viewed, the first cover 493*a* placed on the second board surface 4912 of the first wire 491 to cover the bonding area B1, and, in a state in which the fourth board surface 4922 is viewed, the second cover 493*b* placed on the fourth board surface 4922 of the second wire 492 to cover the bonding area B1.

According to one or more embodiments, the flexible printed circuit board 490 may further include one or more dummy vias 597 configured to penetrate and connect the first cover 493*a* and the second cover 493*b*, and, in a state in which the second board surface 4912 is viewed, the dummy vias 597 may be placed not to overlap with the first signal circuit 495*a* and the second signal circuit 495*b*.

According to one or more embodiments, each of the first cover 493*a* and the second cover 493*b*, in a state in which the second board surface 4912 is viewed, may include the first cover portion 4931 overlapping with the bonding sheet 494 and forming the bonding area B1 and the second cover portion 4932 extending from the first cover portion 4931 in the length direction.

According to one or more embodiments, the first cover 493*a* and the second cover 493*b* may be formed of a flexible material, and, in a process of a change in a distance between the first board surface 4911 and the third board surface 4921 in the second cover portion, may guide the first board surface 4911 and the third board surface 4921 to form a curved surface.

According to one or more embodiments, in a state in which the second board surface 4912 is viewed, each of the first cover 893*a* and the second cover 893*b* may include the first cover portion 8931 overlapping with the bonding sheet 894 and forming the bonding area B1 and the third cover portions 8933*a* and 8933*b* extending from the first cover portion 8931 in a width direction perpendicular to the length direction, in which the plurality of dummy vias 897 configured to penetrate and connect the first cover portion 493*a* and the second cover portion 493*b* may be arranged in the first cover portion and the third cover portion.

According to one or more embodiments, the electronic device 301 includes the first housing 310, the second housing 320 partially movably connected to the first housing 310 in the moving direction D1, the display 261 supported by the first housing 310 and the second housing 320 and configured to change between a first state and a second state, in which an area of a display area visually exposed to an outside according to a relative movement of the first housing and the second housing is at the minimum in the first state and the area of the display area is at the maximum in the second state, and the flexible printed circuit board 490 of which both ends are placed respectively in the first housing 310 and the second housing 320, in which the flexible printed circuit board 490 further includes the first wire 491 including the first length direction L1 and the first signal circuit 495*a* formed along the first length direction L1, the second wire 492 including the second length direction L2 and the second signal circuit 495*b* formed along the second length direction L2 and connected to the first wire 491 through the bonding area B1, the bonding sheet 494 placed in the bonding area B1 and with each of both surfaces bonded to the first wire 491 and the second wire 492, the first cover 493*a*, of which at least a portion is placed in the bonding area B1, placed on a surface of the first wire 491 to be opposed to the bonding sheet 494, the second cover 493*b*, of which at least a portion is placed in the bonding area B1, placed on a surface of the second wire 492 to be opposed to the bonding sheet 494, one or more signal vias 496 penetrating the first wire 491 and the second wire 492 and configured to connect the first signal circuit 495*a* to the second signal circuit 495*b*, and the plurality of dummy vias 597 connected to penetrate the first cover 493*a* and the second cover 493*b*.

In addition, while example embodiments of the disclosure have been shown and described, the disclosure is not limited to the aforementioned specific embodiments, and it is apparent that various modifications may be made by those having ordinary skill in the technical field to which the disclosure belongs, without departing from the gist of the disclosure as claimed by the appended claims. Further, it is intended that such modifications are not to be interpreted independently from the technical idea or prospect of the disclosure.

What is claimed is:

1. An electronic device comprising:

a first housing;

a second housing connected to the first housing, the second housing being partially moveable in a moving direction;

a display supported by the first housing and the second housing and configured to change between a first state and a second state, an area of the display being visually exposed to an outside according to a relative movement of the first housing and the second housing, the first state being a state in which the area of the display is visually exposed at a minimum, the second state being a state in which the area of the display is visually exposed at a maximum; and a flexible printed circuit board having a length in the moving direction which changes based one the movement of the first housing and the second housing, wherein the flexible printed circuit board comprises:

a first wire comprising a first signal circuit formed along a first length direction;

a second wire comprising a second signal circuit formed along a second length direction;

a bonding sheet configured to bond the first wire and the second wire along a bonding area; and one or more signal vias penetrating the first wire and the second wire and configured to electrically connect the first signal circuit to the second signal circuit.

2. The electronic device of claim 1, wherein the first wire comprises a first board surface and a second board surface opposite to the first board surface, wherein the second wire comprises a third board surface and a fourth board surface opposite to the third board surface and, wherein, at the bonding area, the first board surface and the third board surface face each other with the bonding sheet therebetween, the first board surface and the third board surface each having a shape corresponding to a shape of the bonding sheet.

3. The electronic device of claim 2, wherein the flexible printed circuit board further comprises:

a first cover overlapping the bonding sheet on at least a portion of the second board surface; and a second cover overlapping with the bonding sheet on at least a portion of the fourth board surface.

4. The electronic device of claim 3, wherein the flexible printed circuit board further comprises:

one or more dummy vias penetrating the first cover and the second cover.

5. The electronic device of claim 4, wherein the one or more dummy vias are adjacent to the first signal circuit and the second signal circuit in a width direction perpendicular to the first length direction.

6. The electronic device of claim 3, wherein, each of the first cover and the second cover comprises:

a first cover portion overlapping with the bonding sheet; and a second cover portion extending from the first cover portion in the first length direction and the second length direction.

7. The electronic device of claim 6, further comprising:

a plurality of dummy vias penetrating the first cover and the second cover, wherein the plurality of dummy vias comprises:

a plurality of first dummy vias on the first cover portion; and a plurality of second dummy vias on the second cover portion.

8. The electronic device of claim 7, wherein, each of the plurality of first dummy vias are on both sides of the one or more signal vias along a width direction perpendicular to the first length direction.

9. The electronic device of claim 3, wherein each of the first cover and the second cover comprises:

a first cover portion overlapping with the bonding sheet and forming the bonding area; and a pair of third cover portions each extending to both sides of the first cover portion along a width direction perpendicular to the first length direction.

10. The electronic device of claim 9, further comprising:

a plurality of dummy vias penetrating the first cover and the second cover, wherein the plurality of dummy vias comprises:

a plurality of first dummy vias on the first cover portion; and a plurality of third dummy vias on the pair of third cover portions.

11. The electronic device of claim 3, wherein each of the first cover and the second cover have a shape corresponding to a shape of the bonding sheet and overlap with the bonding sheet, and wherein the flexible printed circuit board further comprises:

a plurality of dummy vias penetrating the first cover and the second cover and enclosing a circumference of the one or more signal vias.

12. The electronic device of claim 1, wherein the flexible printed circuit board further comprises:

a first connector connected to a first end of the first wire opposite to the bonding area based on the first length direction; and a second connector connected to a second end of the second wire opposite to the bonding area based on the second length direction.

13. The electronic device of claim 12, wherein the first wire is between the first connector and the bonding area and comprises a first bending portion of which at least a portion partially bends, and wherein the second wire is formed between the second connector and the bonding area and comprises a second bending portion of which at least a portion partially bends.

14. The electronic device of claim 1, wherein the flexible printed circuit board further comprises:

a first rigid member on at least a portion of a surface of the first wire and configured to reinforce a rigidity of the first wire; and a second rigid member on at least a portion of a surface of the second wire and configured to reinforce a rigidity of the second wire.

15. The electronic device of claim 1, wherein the bonding sheet is formed of a material having a rigidity greater than a material of each of the first wire and the second wire.

16. A flexible printed circuit board comprising:

a first wire including a first board surface and a second board surface that is opposite to the first board surface, in which a first signal circuit is formed along a length direction;

a second wire including a third board surface and a fourth board surface that is opposite to the third board surface and connected to the first wire through a bonding area;

a bonding sheet placed in the bonding area and with each of both surfaces bonded to the first board surface and the third board surface;

a signal via penetrating the first wire and the second wire and configured to electrically connect the first signal circuit to the second signal circuit, in a state in which the second board surface is viewed, a first cover placed on the second board surface of the first wire to cover the bonding area; and wherein a second cover placed on the fourth board surface of the second wire to cover the bonding area.

17. The printed circuit board of claim 16, wherein
the flexible printed circuit board further comprises one or more dummy vias configured to penetrate and connect the first cover and the second cover, and
wherein the dummy vias are placed not to overlap with the first signal circuit and the second signal circuit.

18. The printed circuit board of claim 16, wherein
each of the first cover and the second cover include,
a first cover portion overlapping with the bonding sheet and forming the bonding area, and a second cover portion extending from the first cover portion in the length direction.

19. The printed circuit board of claim 18, wherein
the first cover and the second cover are formed of a flexible material, and
in a process of a change in a distance between the first board surface and the third board surface in the second cover portion, the first cover and the second cover guide the first board surface and the third board surface to form a curved surface.

20. A electronic device comprising:
a first housing;
a second housing connected to the first housing, the second housing being partially moveable in a moving direction;
a display supported by the first housing and the second housing and configured to change between a first state and a second state, an area of the display being visually exposed to an outside according to a relative movement of the first housing and second housing, the first state being a state in which the area of the display is visually exposed at a minimum, the second state being a state in which the area of the display is visually exposed at a maximum; and a flexible printed circuit board of which both ends are placed respectively in the first housing and the second housing, and
wherein the flexible printed circuit board comprises:
a first wire comprising a first signal circuit formed along a first length direction;
a second wire comprising a second signal circuit formed along a second length direction, and connected to the first wire through a bonding area, a bonding sheet placed in the bonding area and with each of both surfaces bonded to the first wire and the second wire;
a first cover, of which at least a portion is placed in the bonding area, placed on a surface of the first wire to be opposed to the bonding sheet;
a second cover, of which at least a portion is placed in the bonding area, placed on a surface of the second wire to be opposed to the bonding sheet;
one or more signal vias penetrating the first wire and the second wire and configured to connect the first signal circuit to the second signal circuit; and
a plurality of dummy vias connected to penetrate the first cover and the second cover.

* * * * *